(12) United States Patent
Nakajima et al.

(10) Patent No.: US 7,151,311 B2
(45) Date of Patent: Dec. 19, 2006

(54) MOLD RESIN-SEALED POWER SEMICONDUCTOR DEVICE HAVING INSULATING RESIN LAYER FIXED ON BOTTOM SURFACE OF HEAT SINK AND METAL LAYER ON THE RESIN LAYER

(75) Inventors: Dai Nakajima, Tokyo (JP); Kazuhiro Tada, Tokyo (JP); Taketoshi Shikano, Fukuoka (JP); Yasunari Hino, Tokyo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 0 days.

(21) Appl. No.: 10/413,288

(22) Filed: Apr. 15, 2003

(65) Prior Publication Data
US 2004/0089928 A1 May 13, 2004

(30) Foreign Application Priority Data
Nov. 11, 2002 (JP) .......................... 2002-327072

(51) Int. Cl.
*H01L 23/34* (2006.01)

(52) U.S. Cl. ........................................ 257/728; 257/776
(58) Field of Classification Search ................ 257/728, 257/776, 666
See application file for complete search history.

(56) References Cited

U.S. PATENT DOCUMENTS

| | | | | |
|---|---|---|---|---|
| 5,345,106 A | * | 9/1994 | Doering et al. | ............. 257/675 |
| 5,521,429 A | * | 5/1996 | Aono et al. | .................. 257/676 |
| 6,313,598 B1 | | 11/2001 | Tamba et al. | |
| 6,404,065 B1 | | 6/2002 | Choi | |
| 2003/0183907 A1 | * | 10/2003 | Hayashi et al. | ............. 257/666 |

FOREIGN PATENT DOCUMENTS

| | | |
|---|---|---|
| EP | 1 132 961 | 9/2001 |
| EP | 1 193 727 | 4/2002 |
| JP | 2-150415 | 6/1990 |
| JP | 2-114943 | 9/1990 |
| JP | 5-55301 | 3/1993 |
| JP | 9-64248 | 3/1997 |
| JP | 2000-191751 | 7/2000 |
| JP | 2002-3641 | 1/2002 |
| JP | 2002-76204 | 3/2002 |
| JP | 2002-184907 | 6/2002 |
| JP | 2002-270736 | 9/2002 |
| KR | 2001-0030702 | 4/2001 |
| KR | 2001-0071079 | 7/2001 |

* cited by examiner

*Primary Examiner*—Phat X. Cao
(74) *Attorney, Agent, or Firm*—Oblon, Spivak, McClelland, Maier & Neustadt, P.C.

(57) ABSTRACT

An insulating sheet consisting of a metal layer and an unhardened insulating resin layer is formed. The insulating resin layer contains a filler having grains of, e.g., scale-like shape and has thixotropy, and its outer size is larger than that of a bottom surface of a metal plate. The insulating sheet is disposed on a bottom surface of a cavity of a mold die and the metal plate is disposed on an upper surface of the insulating resin layer. On a main surface of the metal plate, a power semiconductor chip connected to a frame and another frame through a wire is mounted. The cavity is fully filled with a liquid mold resin in this state. After that, the insulating resin layer is hardened at the same timing as the hardening of the mold resin, and the insulating resin and the metal plate are fixed to each other. An interface between the insulating resin layer and the metal plate is included in the upper surface of the insulating resin layer.

4 Claims, 11 Drawing Sheets

| THICKNESS OF HEAT SINK 8 (mm) | ADHESION BETWEEN MEMBERS 6 AND 8 AFTER MOLDING | |
|---|---|---|
| 0.8 | × | PARTLY NOT ADHERED |
| 2 | △ | DEFLECTION OR WARP IN CU PLATE |
| 3 | ○ | NO PROBLEM |
| 4 | ○ | NO PROBLEM |

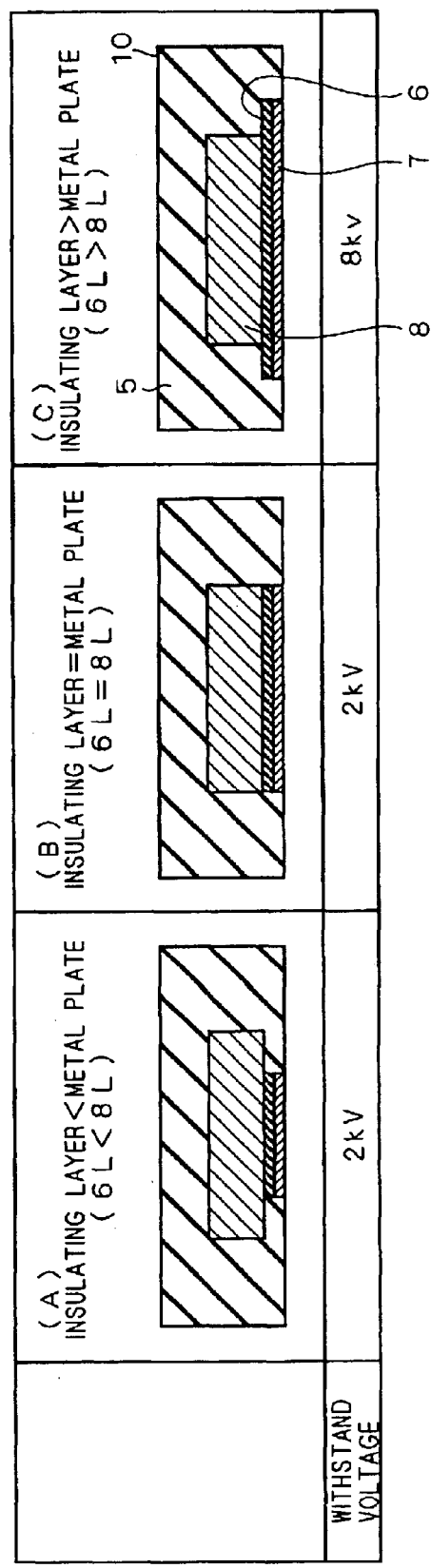

FIG. 10

| CASES | (A) MOLDING AFTER BONDING INSULATING SHEET TO METAL PLATE IN ADVANCE | (B) FIXING INSULATING SHEET TO METAL PLATE SIMULTANEOUSLY WITH IMPLANTATION OF MOLD RESIN | (C) FIXING INSULATING SHEET TO METAL PLATE SIMULTANEOUSLY WITH IMPLANTATION OF MOLD RESIN | (D) FIXING INSULATING SHEET TO METAL PLATE SIMULTANEOUSLY WITH IMPLANTATION OF MOLD RESIN |
|---|---|---|---|---|
| MOLD RESIN IMPLANTATION PRESSURE | $9.86 \times 10^6$ Pa | $6.86 \times 10^6$ Pa | $9.8 \times 10^6$ Pa | $1.274 \times 10^7$ Pa |
| WITHSTAND VOLTAGE VALUE | 2kV | 5kV | 7kV | 8kV |

MOLD RESIN-SEALED POWER SEMICONDUCTOR DEVICE HAVING INSULATING RESIN LAYER FIXED ON BOTTOM SURFACE OF HEAT SINK AND METAL LAYER ON THE RESIN LAYER

BACKGROUND OF THE INVENTION

1. Field of the Invention

The present invention relates to a power semiconductor device which is sealed with a mold resin and a method of manufacturing the power semiconductor device. Particularly, the power semiconductor device of the present invention comprises an insulating sheet which is a complex of an insulating resin layer and a metal layer.

2. Description of the Background Art

The first prior art of the mold resin-sealed power semiconductor device is a device disclosed in Japanese Patent Application Laid-Open No. 2000-138343 (Patent Document 1). In this prior-art device, a power chip is fixed onto a first frame with solder and a surface electrode of the power chip and an electrode provided on a second frame are interconnected with a wire. The first and second frames are entirely covered with a mold resin.

The second prior art of the mold resin-sealed power semiconductor device is a device disclosed in Japanese Patent Application Laid-Open No. 2001-156253 (Patent Document 2). In this prior-art device, a power chip is fixed on an upper surface of a frame and a lower surface thereof is in direct contact with or fixed onto an insulating substrate 201 with high thermal conductivity which is made of $Al_2O_3$, AlN, BeO or the like, and then the frame, the power chip and the insulating substrate are sealed with a mold resin.

The third prior art of the mold resin-sealed power semiconductor device is a device disclosed in Japanese Patent Application Laid-Open No. 2002-76204 (Patent Document 3). In this prior-art device, an insulating resin layer formed of a sheet-like thermosetting resin is fixed on an upper surface of a metal radiator plate whose lower surface is exposed outside and after that, an unhardened bonding layer is formed on the insulating resin layer and a frame on which a power semiconductor chip is mounted is further bonded to the bonding layer, and then the whole is sealed with a mold resin.

The fourth prior art of the mold resin-sealed power semiconductor device is a device disclosed in Japanese Patent Application Laid-Open No. 10-125826 (Patent Document 4). In this prior-art device, an insulative bonding sheet is inserted between a lead frame and a heat sink, and the lead frame and the heat sink are fixed to each other with the insulative bonding sheet simultaneously with a mold-resin sealing.

[Patent Document 1] Japanese Patent Application Laid-Open No. 2000-138343 (FIG. 6)

[Patent Document 2] Japanese Patent Application Laid-Open No. 2001-156253 (FIGS. 1 and 3)

[Patent Document 3] Japanese Patent Application Laid-Open No. 2002-76204 (FIGS. 1 and 2)

[Patent Document 4] Japanese Patent Application Laid-Open No. 10-125826 (FIG. 2)

[Patent Document 5] Japanese Patent Application Laid-Open No. 2002-184907 (FIGS. 1 and 2)

[Patent Document 6] Japanese Patent Application Laid-Open No. 2002-128993

[Patent Document 7] Japanese Patent Application Laid-Open No. 2002-53642

[Patent Document 8] Japanese Patent Application Laid-Open No. 10-261744 (FIG. 1)

[Patent Document 9] Japanese Patent Application Laid-Open No. 2000-58575 (FIG. 1)

<Problems of the First Prior Art>

As a material of a mold resin, for example, an epoxy resin with an inorganic filler mixed therein is used. As the percentage of content of the inorganic filler increases, the mold resin has higher thermal conductivity and can more efficiently radiate the heat of the power semiconductor chip to a back side of a module. If the percentage of content of the inorganic filler increases for high thermal radiation, however, the viscosity of the resin contrarily increases, and when the volume percentage of content of the inorganic filler is over 80%, for example, it disadvantageously becomes hard to form the mold resin. As a material of the inorganic filler, silica is generally used, but if alumina, aluminum nitride, silicon nitride or boron nitride, for example, is used instead, it is possible to increase the thermal conductivity of the mold resin to 5 W/mK or higher. Since such an inorganic filler is expensive, however, mixing the expensive inorganic filler in the mold resin which forms the whole of module at high percentage is extremely uneconomical and not a practical technique.

Therefore, in the structure where the mold resin is rounded towards the lower surface of the frame, like in the exemplary structure of the first prior art, there is a limitation in reducing the thermal resistance. Specifically, though it is possible to increase the thermal conductivity of the mold resin by increasing the percentage of filler content, when the percentage of filler content is too high, the viscosity of the mold resin becomes too high and disadvantageously, the mold resin can not be rounded to the lower surface of the frame.

Further, when alumina, boron nitride, aluminum nitride or the like, each of which has high thermal conductivity, is used instead of silica which is generally used as a material of the inorganic filler, the cost of the inorganic filler becomes higher and moreover the amount of required inorganic filler is enormous since the mold resin forms the whole of module, and therefore using the above material for the inorganic filler is so uneconomical.

Accordingly, in the power semiconductor device using the insulating resin of the first prior art, it is hard to increase current-carrying capacity, in other words, to deal a high heat.

Additionally, when the semiconductor device of the first prior art is screwed on the radiating fin, if a foreign matter such as a resin burr exists between a surface of the radiating fin and a main surface of the semiconductor device, there arises a problem that an insulating layer formed of the mold resin may be broken.

Further, when the semiconductor device of the first prior art is attached to the heat sink, such a careful handling is needed as not to damage the insulating layer with a corner or the like.

Furthermore, in an aerobic atmosphere, if the semiconductor device of the first prior art is kept for a long time at a high temperature such as about 200° C., this causes a problem that the mold resin is deteriorated by oxidation.

<Problems of the Second Prior Art>

In the semiconductor device of the second prior art, a ceramic substrate which forms part of a main surface of a package is exposed, and the ceramic substrate is made of a brittle material and there is a possibility that a high stress should be applied to the ceramic substrate to cause breakage therein, depending on the matching of projections and depressions due to the warp in the semiconductor device and that in the radiating fin to which the semiconductor device is attached. This requires a control of size that is stricter than necessary.

When the semiconductor device does not have the exposed ceramic substrate of the second prior art, it is possible to reduce the warp by controlling the ingredient of the filler or the percentage of its content so that the coefficient of linear expansion of the mold resin can roughly approximate to that of a metal frame. Since there is generally a great difference between the coefficient of linear expansion of the metal frame and that of ceramic, however, for example, the coefficient of linear expansion of Cu is $17 \times 10^6$/K while that of $Al_2O_3$ is $5 \times 10^6$/K, there arises a problem of warp. This point will be further discussed.

When the ceramic substrate is used, like in the second prior art, there is a problem of warp caused by the difference in coefficient of linear expansion from the mold resin and the temperature change in using the module.

Specifically, the coefficient of linear expansion of Cu is $17 \times 10^6$/K while that of $Al_2O_3$ is $5 \times 10^6$/K, and there is a great difference in coefficients of linear expansion between them. Since heating is inevitable in the semiconductor device for controlling high current to which the present invention is directed, a high thermal stress is caused in a junction interface between Cu and the ceramic material by the difference in coefficient of linear expansion and the temperature change in using them, which further causes a warp or a crack.

Thus, when the ceramic substrate is exposed on the back surface side of the device, there is a problem that a thermal stress is caused by a great difference in coefficient of linear expansion and this, accompanying the temperature change, causes a warp and a crack in the ceramic substrate or/and the mold resin. Therefore, there is considerable inconvenience in handling due to inevitable characteristics of ceramic, i.e., high stiffness and brittleness.

Additionally, the package made of the mold resin is formed by implanting a liquid resin into a cavity formed between a plurality of mold dies and in this process, it is inevitable to cause burrs in interfaces between the mold dies. If an insulating resin which is different from the mold resin is used, there is a possibility that the burrs should fall to be left on surfaces of the mold dies when a work is removed after molding. Therefore, there may arise a problem that the ceramic substrate directly presses the burrs, thereby being broken.

<Problems of the Third Prior Art>

In the third prior art, two kinds of resin layers, i.e., the insulating resin layer and the bonding layer, are needed and the thermal resistance necessarily becomes high. Since the bonding layer, in particular, needs a thickness to smooth out the warp or/and unevenness of members in bonding, there is a serious problem that poor adhesion may occur if the bonding layer does not have a thickness of about 100 μm or more and accordingly the thermal resistance necessarily becomes high.

Moreover, the frame is directly bonded onto the bonding layer in the third prior art, and even when a pressure is applied from the insulating resin layer to part of the frame disposed in the bonding surface, the frame is inclined at a fulcrum of other part thereof which is connected to an exterior electrode, and this causes a problem that it is hard to perform a uniform bonding and poor adhesion may occur.

Further, a complex of the insulating resin layer and the metal plate is achieved by coating the metal plate with the insulating resin layer and applying a pressure to the insulating resin layer for a set period of time while heating, and in this process, there are constrains on the device, such as the necessity of air exhaustion to vacuum for avoiding voids, and therefore a batch processing step using a vacuum press device is needed. Though it is possible to use a process of bonding a plurality of metal plates and a plurality of insulating resin layers at one press with released papers or the like inserted therebetween for reduction of cost, there is a limit in the area of metal plate to be processed at one press and therefore it is hard to reduce the cost.

Furthermore, it is very complicate to further layer the bonding layer on the metal plate with the insulating resin layer which is produced by the above method.

<Problems of the Fourth Prior Art>

In the fourth prior art, it is difficult to use an insulating sheet with high thermal conductivity because of a problem in handling and moreover since it is necessary to bond two interfaces between the insulative bonding sheet and the frame and between the insulative bonding sheet and the heat sink at the same time, voids are liable to enter the bonding layer and this is likely to cause problems in withstand voltage characteristics and thermal radiation.

<Summary of Problems>

As discussed above, the prior-art power semiconductor device has the problem that the insulating layer is liable to break depending on how to handle since the insulating resin layer (first prior art) or the ceramic substrate (second prior art) is naked at the back surface. Additionally, the first prior art has the problem that the mold resin is deteriorated when exposed at high temperature in an aerobic atmosphere. The first prior art further has the problem that it is difficult to form a thin insulating layer of a resin with high thermal conductivity due to constraints in molding of the resin and it is impossible to reduce the thermal resistance. Furthermore, the first prior art has a great problem in handling, that the insulating layer is liable to break when the insulating layer is so placed as to come into contact with projections or/and foreign matters in handling the package, or the like.

The power semiconductor device of the third prior art has the problem that the thermal resistance becomes high since the bonding layer is layered on the metal plate aside from the insulating resin layer. The power semiconductor device of the third prior art further has the problem of poor productivity and high cost in the process of layering the metal plate and the insulating resin layer because of the thick metal plate.

The power semiconductor device of the fourth prior art has the problem that the voids are liable to enter the interfaces in a process of bonding the insulative bonding sheet.

SUMMARY OF THE INVENTION

It is a main object of the present invention to provide a mold resin-sealed power semiconductor device comprising an insulating resin layer which is easy to handle and has low thermal resistance and high reliability at low cost.

The present invention is intended for a mold resin-sealed power semiconductor device. According to the present invention, the mold resin-sealed power semiconductor device has an insulating sheet which has a layered structure of an insulating resin layer and a metal layer and is fixed onto a bottom surface of a metal plate serving as a heat sink on which a power semiconductor chip is mounted.

In the mold resin-sealed power semiconductor device of the present invention, the insulating resin layer can be protected by using the metal layer positioned below the insulating resin layer as a bottom surface of the device which is in contact with a radiating fin outside the semiconductor device, and moreover the insulating resin layer and the metal layer are formed (layered) as a unit. As a result, it is possible to improve the reliability and the handling of the insulating resin layer.

The present invention is also intended for a method of manufacturing the mold resin-sealed power semiconductor device. According to the present invention, the method includes the following steps (a) to (d). The step (a) is to dispose an insulating sheet which is a complex of a metal layer and an unhardened insulating resin layer which is layered and fixed onto an upper surface of the metal layer in a predetermined position of a mold die, to bring a lower surface of the metal layer into surface-to-surface contact with a cavity bottom surface of the mold die. The step (b) is to dispose a metal plate serving as a heat sink which comprises a main surface on which a power semiconductor chip is mounted and a bottom surface opposed to the main surface in a direction of its thickness on a surface of the insulating sheet inside the mold die, to bring the bottom surface of the metal plate into surface-to-surface contact with an upper surface of the unhardened insulating resin layer. The step (c) is to implant a mold resin in a cavity of the mold die while applying a pressure to the insulating sheet from the metal plate. The step (d) is to harden the mold resin and the unhardened insulating resin layer by stopping application of the pressure after the cavity is wholly filled with the mold resin.

In the method of manufacturing the mold resin-sealed power semiconductor device of the present invention, since the metal plate and the insulating resin sheet are fixed to each other through the steps of implanting and hardening the mold resin, it is possible to easy prevent deformation of the insulating resin sheet which is liable to occur in fixing process especially when the outer shape of the insulating resin sheet is larger than that of the metal plate. As a result, the metal plate and the insulating resin sheet can be fixed to each other without deteriorating the withstand voltage characteristics and there is no necessity to unnecessarily thicken the insulating resin layer, and therefore lower thermal resistance of the insulating resin layer is achieved.

These and other objects, features, aspects and advantages of the present invention will become more apparent from the following detailed description of the present invention when taken in conjunction with the accompanying drawings.

BRIEF DESCRIPTION OF THE DRAWINGS

FIG. 9 is a table showing a measurement result of withstand voltage characteristics on various prototypes of structure of the mold resin-sealed power semiconductor device in accordance with the second preferred embodiment;

FIG. 10 is a table showing an experimental result on the mold resin-sealed power semiconductor device in accordance with the second preferred embodiment;

DESCRIPTION OF THE PREFERRED EMBODIMENTS (The First Preferred Embodiment)

Figure 1:
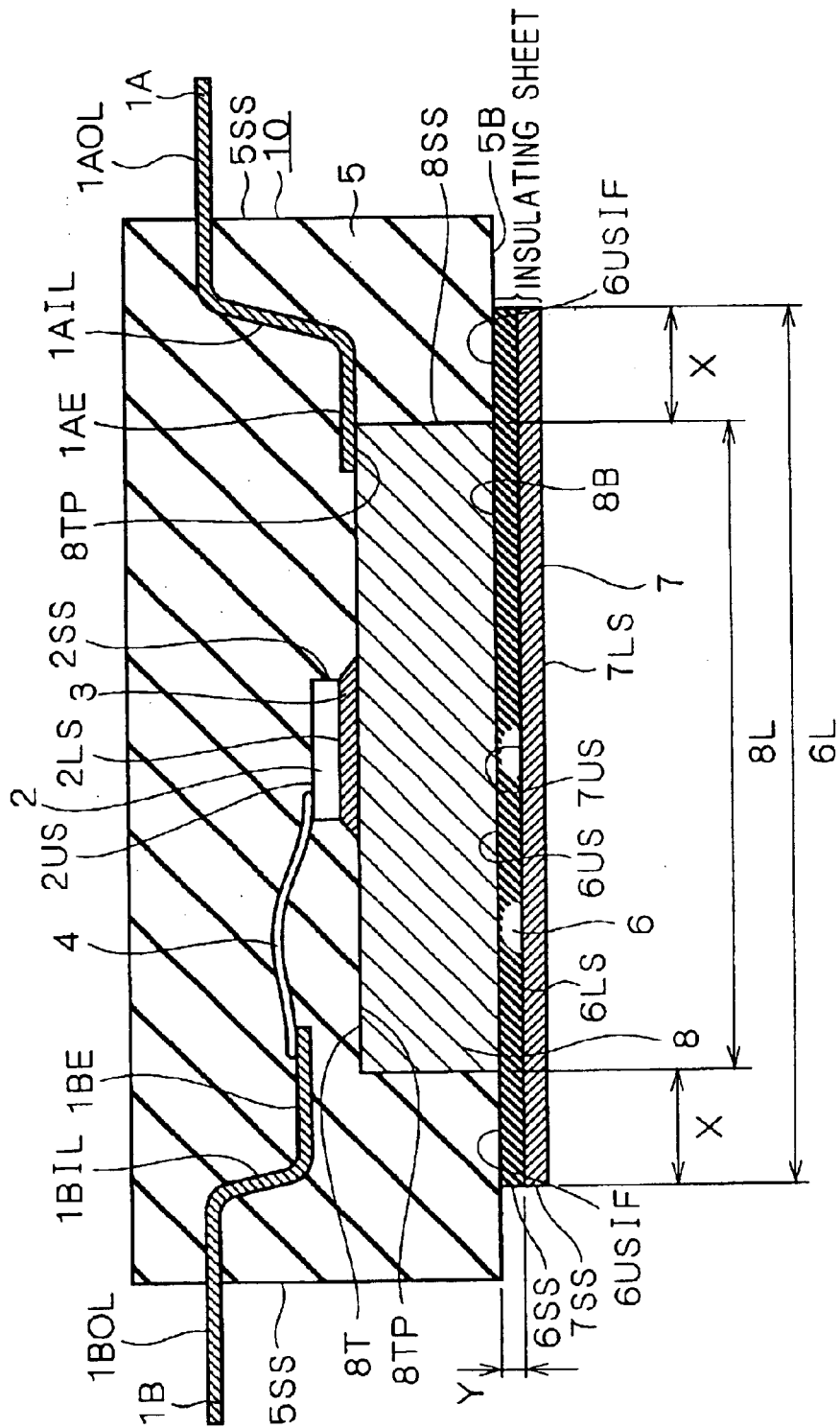
FIG. 1 is a longitudinal section showing a structure of a mold resin-sealed power semiconductor device in accordance with a first preferred embodiment.

FIG. 1 is a longitudinal section schematically showing a structure of a mold resin-sealed power semiconductor device in accordance with the first preferred embodiment. The characteristic feature of the device shown in FIG. 1 lies in that a metal plate, serving as a heat sink, having an upper surface on which a power semiconductor chip is mounted is sealed together with the power semiconductor chip with the mold resin so that a bottom surface of the metal plate can be exposed outside, to form a package and an insulating sheet having a layered structure (complex) of a metal layer and an insulating resin layer is fixed onto a bottom surface of the package (in other words, the bottom surface of the metal plate). The characteristic feature will be discussed in detail with reference to FIG. 1.

In FIG. 1, a block-like metal plate 8 is a heat sink comprising a main surface 8T which is a top surface, a bottom surface 8B opposed to the main surface 8T in a direction of its thickness, having the same shape and the same size as the main surface 8T, and side surfaces 8SS sandwiched between the main surface 8T and the bottom surface 8B.

A first lead frame 1A which is one of a plurality of frames comprises a first inner lead portion 1AIL bent in an L shape and a first outer lead portion 1AOL continuously connected to the first inner lead portion 1AIL, straightly extending. A tip portion 1AE of the first inner lead portion 1AIL is directly fixed onto a peripheral portion 8TP of the main surface 8T of the metal plate 8, and the first lead frame 1A and the metal plate 8 are electrically connected to each other. On the other hand, the whole first outer lead portion 1AOL is projected outside from one side surface 5SS of a package 10 discussed later. Similarly, a second lead frame 1B which is one of a plurality of frames comprises a second inner lead portion 1BIL bent in an L shape and a second outer lead portion 1BOL continuously connected to the second inner lead portion 1BIL, straightly extending. An electrode is provided at a tip portion 1BE of the second inner lead portion 1BIL and the whole second outer lead portion 1BOL is projected outside from the other side surface 5SS of the package 10. These frames 1A and 1B are Cu frames each having a thickness of, e.g., 0.8 mm. For reduction of the thermal resistance, a step structure is adopted as the positional relation of the tip portions 1AE and 1BE of these lead frames 1A and 1B in a direction of thickness of the package 10.

A not-shown conductive pattern is formed on a lower surface 2LS of a power semiconductor chip 2 (e.g., IGBT or power MOSFET) and the lower surface 2LS is fixed onto a substantial center portion of the main surface 8T of the metal plate 8 with a conductive layer 3 through the conductive pattern. In this case, as an example, a solder layer is adopted as the conductive layer 3 and accordingly the power semiconductor chip 2 is soldered onto the main surface 8T of the metal plate 8. An electrode pattern (not shown) is formed on an upper surface 2US which is opposed to the lower surface 2LS in a direction of thickness of the power semiconductor chip 2 and the electrode pattern on the upper surface 2US is electrically connected to the electrode at the tip portion 1BE of the second inner lead portion 1BIL through a metal wire 4. In this case, as an example, an aluminum wire having a diameter of 400 μm is used as the metal wire 4. The power semiconductor chip 2 further has side surfaces 2SS sandwiched between the upper surface 2US and the lower surface 2LS.

An upper surface 6US of an insulating resin layer 6 is fixed onto the bottom surface 8B of the metal plate 8 and a bottom surface 5B of the package 10 or a mold resin 5, being in contact with the whole bottom surface 8B and part of the bottom surface 5B. In this case, the insulating resin layer 6 is fixed onto the bottom surface 8B of the metal plate 8 which is part of the bottom surface 5B of the package 10 by applying a pressure while heating. At that time, an adhesive action is also exerted between the bottom surface 5B of the mold resin 5 around near the bottom surface 8B of the metal plate 8 and a peripheral portion of the upper surface 6US of the insulating resin layer 6, though the adhesive strength is weaker than that between the upper surface 6US of the insulating resin layer 6 and the bottom surface 8B of the metal plate 8. The insulating resin layer 6 has a lower surface 6LS which is opposed to the upper surface 6US in a direction of its thickness and has the same shape and the same size as the upper surface 6US and side surfaces 6SS which are sandwiched between the upper surface 6US and the lower surface 6LS. In this case, as an example, the insulating resin layer 6 is an epoxy resin with an inorganic filler of boron nitride powder mixed therein at a mass percentage of 50%. The thickness of the insulating resin layer 6 is set in a range from 100 μm to 500 μm.

Further, an upper surface 7US of a metal layer 7 is fixed to the lower surface 6LS of the insulating resin layer 6, being in contact with the lower surface 6LS. The metal layer 7 has a lower surface 7LS which is opposed to the upper surface 7US in a direction of its thickness and entirely exposed outside and side surfaces 7SS which are sandwiched between the upper surface 7US and the lower surface 7LS. The metal layer 7 has the same shape as the insulating resin layer 6 and moreover the upper surface 7US and the lower surface 7LS of the metal layer 7 have the same size as the lower surface 6LS of the insulating resin layer 6. Therefore, side surfaces of the insulating sheet consisting of the metal layer 7 and the insulating resin layer 6 layered thereon consist of the side surfaces 7SS of the metal layer 7 and the side surfaces 6SS of the insulating resin layer 6. The lower surface 7LS of the metal layer 7 is an exposed surface of the present semiconductor device, serving as a surface in contact with an outside radiating fin (not shown). In this case, as an example, a Cu foil having a thickness of about 100 μm is used as the metal layer 7.

The mold resin 5 fully covers only the first and second inner lead portions 1AIL and 1BIL, the metal wire 4, the upper surface 2US and the side surfaces 2SS of the power semiconductor chip 2, the conductive layer 3, the main surface 8T and the side surfaces 8SS of the metal plate 8 and an interface 6USIF between the bottom surface 5B of the package 10 and the upper surface 6US of the insulating resin layer 6 so that the bottom surface 8B of the metal plate 8 can be exposed, to accordingly form the package 10 which contains the above constituent elements 1AIL, 1BIL, 2, 3, 4 and 8 therein. In this case, an example, an epoxy resin with silica mixed therein as a filler at a mass percentage of about 70% as the mold resin 5.

As discussed above, in the mold resin-sealed power semiconductor device of FIG. 1, the bottom surface 8B of the metal plate 8 is part of the bottom surface 5B of the package 10, and a longitudinal size 6L of the upper surface 6LS of the insulating resin layer 6 in the longitudinal section is larger than a longitudinal size 8L of the bottom surface 8B of the metal plate 8 and moreover the upper surface 6US of the insulating resin layer 6 entirely includes the interface 8B between the insulating resin layer 6 and the metal plate 8. Therefore, the side surfaces 6SS of the insulating resin layer 6 and the side surfaces 7SS and the lower surface 7LS of the metal layer 7 are entirely exposed outside.

Since the metal layer 7 covers the surface of the insulating resin layer 6, the strength of the insulating resin layer 6 is increased and the handling of the insulating resin layer 6 is remarkably improved.

The thermal resistance of the mold resin-sealed power semiconductor device generally depends on the thermal resistances of all the constituent elements located in a range from the power semiconductor chip inside the mold resin to the radiating surface present on the bottom surface of the mold resin, and if an insulating layer is provided therebetween, since the thermal conductivity of the insulating layer is smaller than that of a metal, the presence of the insulating layer has a great influence on the thermal resistance of the whole device. In the present semiconductor device, however, the insulating resin layer 6 which is a constituent of the complex insulating sheet is fixed onto the bottom surface 5B of the package 10 from the outside of the mold resin package 5. Therefore, if the insulating resin layer is provided inside the mold resin, there arises a limitation that the packing fraction of inorganic filler contained in the insulating resin layer should be lowered in order to reduce the viscosity of the insulating resin in mold sealing, but the present semiconductor device, having no limitation of packing, produces an effect of easily achieving and using the insulating resin layer 6 with high thermal conductivity by relatively increasing the packing fraction of inorganic filler contained therein. Conversely, it is possible to easily achieve the insulating resin layer 6 with relatively high thermal conductivity even if the packing fraction of inorganic filler contained therein is not increased so much. Further, since the silica mixed in the epoxy resin which is a material of the mold resin 5 is relatively cheap, even when the amount of mold resins increases by external provision of the insulating sheet, the influence on the cost is small. Therefore, in the first preferred embodiment, it is possible to achieve a power module with low thermal resistance at the minimum cost.

As discussed above, in the first preferred embodiment, the insulating sheet which is a complex having a layered structure of the insulating resin layer 6 and the metal layer 7 is positively used as a characteristic member. Then, detailed discussion will be made below on a method of manufacturing the insulating sheet and effects of the method, for explaining a reason why the first preferred embodiment adopts the above insulating sheet.

<Manufacture of Insulating Sheet>

Combining the insulating resin layer 6 and the metal layer 7 is performed in the following steps. First, two rollers opposed to each other at an interval are wound with a strip-like metal layer made of, e.g., Cu foil in a roll. Then, these rollers are driven to translationally transfer each portion of the rolled strip-like metal layer between these rollers, and a raw material of insulating resin in which a predetermined inorganic filler, a predetermined solvent and an epoxy resin ingredient are mulled in advance is applied onto an upper surface of the metal layer during the transfer between these rollers, squeezing and rolling the applied raw material of insulating resin, to even the raw material of insulating resin on the metal layer into a predetermined thickness. After that, in order to release the solvent ingredient which is added in advance for good mixture of the inorganic filler into the epoxy resin, a portion of the metal layer with the sheet-like raw material of insulating resin is dried. Continuously performing such a series processing, the raw material of insulating resin having a predetermined thickness is uniformly formed entirely on the upper surface of the strip-like metal layer while all the metal layer with the raw material of insulating resin is wound on the following rollers on the rear side. After that, the strip-like metal layer with the raw material of insulating resin is taken out from the rear-side rollers and cut into sheets of appropriate size. The cut sheets are accumulated into several tens of layers with a piece of released paper inserted between one and another, and a pressure is preliminarily applied to the accumulated sheets for several tens of minutes to preliminarily harden the insulating resin layer lest the reaction of the unhardened insulating resin layer is completed. Next, a pressure is applied to the accumulated sheets by a press to punch a plurality of small pieces of sheets into a predetermined size. This small piece which is obtained in this press step corresponds to the unhardened insulating sheet (6+7) (before fixing) shown in FIG. 1. Since the insulating resin layer 6 is originally brittle (figuratively describing, the insulating resin layer 6 is only as strong as potato chips or so), as discussed above, the insulating resin layer is hardened to some degrees by the preliminary heating in the press step.

Thus, the process step of coating the metal layer with the insulating resin in the ante-stage is sequentially performed and the process step of applying a pressure while heating in the post-stage is performed in a batch since a certain period of process time is needed.

Though the Cu foil having a thickness of about 100 μm is used as an example of the material of the metal layer 7 in the first preferred embodiment, any Cu foil having a thickness not less than 75 μm and less than 200 μm may be used as the material of the metal layer 7. Since the strip-like metal layer 7 can be wound in a roll in transfer only if the thickness of Cu foil falls within this range, high productivity is achieved. In contrast to this, if the thickness of Cu foil is less than 50 μm, there arises another problems in manufacture that the Cu foil is liable to break or wrinkles are liable to occur in the Cu foil. On the other hand, if the thickness of Cu foil is not less than 200 μm, there arises still another problem that the Cu foil becomes hard to handle in a roll and needs to be transferred in a sheet, thereby causing an increase in cost.

Further, in the first preferred embodiment, the unhardened raw material of insulating resin layer is made by mulling the predetermined inorganic filler in the unhardened epoxy resin at a predetermined ratio and then the above manufacturing method is performed, to form the unhardened insulating resin layer 6 which is layered on the metal layer 7 of Cu foil. In this case, for example, any one of alumina powder, silicon nitride powder, aluminum nitride powder or boron nitride powder, or a mixture of at least two kinds out of the above powders is mixed as the inorganic filler into the epoxy resin at a mass percentage of, e.g., about 40% to 60%, to be used as the material of the insulating resin layer 6. It is desirable that the thickness of the insulating resin layer 6 should be in a range from 100 μm to 500 μm. If the insulating resin layer 6 is thicker than this range, contrarily, squeezing can not be smoothly performed, and if it is thinner than this range, squeezing can not be performed. The present inventors set the thickness of the insulating resin layer 6 to be, e.g., about 200 μm.

Since the insulating resin layer 6, which is very hard to handle because of its extreme brittleness when used singly, is used as the complex insulating sheet with the metal layer 7, as discussed above, the brittleness or the strength of the insulating resin layer 6 is reinforced by the metal layer 7 and handling of the insulating sheet is very easy. Moreover, there is no case where corners of the complex insulating sheet become chipped, because of reinforcement by the metal layer 7. Further, since the above method is used, it is possible to dramatically increase the number of complex insulating sheets which can be produced at one processing. In this point, the complex insulating sheet has a structure to allow a manufacturing method with high productivity.

On the other hand, the prior art where the insulating resin layer is formed directly on the upper surface of the metal plate which is a thick heat sink needs a step of fully hardening the insulating resin layer while keeping a state of applying a pressure by a press, as a process step of bonding the insulating resin layer to the metal plate. Therefore, the number of complexes of the insulating resin layer and the metal plate (heat sink) which can be produced at one processing in the prior art is much less than the number of complex insulating sheets to be produced at one processing in the first preferred embodiment. As compared with the prior art from the viewpoint of cost, the first preferred embodiment using the complex insulating sheet and the above manufacturing method (the same applies to the second preferred embodiment discussed later) can reduce the cost by a factor of about five.

As discussed above, the first preferred embodiment uses the brittle insulating resin layer 6 which is hard to singly handle as a complex with the metal layer 7 which is easy to handle and moreover makes it possible to practically achieve the insulating resin layer 6 while remarkably reducing the cost for obtain the complex.

Though the Cu foil is used as an example of the material of the metal layer 7, the material is not limited to this and other material can be used as the material of the metal layer 7. For example, an Al foil can be used as the material of the metal layer 7. In this case, even if a foreign matter which is smaller than the thickness of the metal layer 7 gets caught between the surface of the metal layer 7 and the outside radiating fin (not shown), this causes only local deformation of the metal layer 7, and the foreign matter has no influence on the degree of adhesion between the surface of the metal layer 7 and the radiating fin or on the fixing between the metal layer 7 and the insulating resin layer 6. Therefore, the reliability of the complex insulating sheet (7+6) increases.

An outline of a process of manufacturing the semiconductor device having the structure of FIG. 1 is as follows.

Specifically, the power semiconductor chip 2 is fixed onto the center portion of the upper surface 8T of the metal plate 8 with, e.g., the solder 3 and the tip portion 1AE of the first inner lead portion 1AIL is fixed onto one of the peripheral portions 8TP of the upper surface 8T of the metal plate 8 by, e.g., welding, and further the electrode of the upper surface 2US of the power semiconductor chip 2 and the electrode provided at the tip portion 1BE of the second inner lead portion 1BIL are interconnected with the aluminum wire 4.

Next, a complex consisting of all the lead frames 1A, 1B, . . . , the power semiconductor chip 2, the solder layer 3, the aluminum wire 4 and the metal plate (heat sink) 8 is disposed inside the mold die (not shown). Then, the inside of the cavity of the mold die is filled with the liquid mold resin 5 and in this state, the mold resin 5 is hardened (gelated), to seal the above complex with the mold resin.

Finally, the insulating sheet which is a united complex of the metal layer 7 and the insulating resin layer 6 is so disposed as to be superimposed on the exposed bottom surface 8B of the molded package 10, and a pressure is applied to the insulating sheet under heating, to fix the upper surface 6US of the insulating sheet to the surfaces 8B and 6USIF of the package 10. Thus obtained is the structure where the radiating surface 8B of the metal plate 8 is covered with the insulating resin layer 6 and the insulating resin layer 6 is entirely protected by the metal layer 7.

In order to prevent bubbles from entering the interface to which the insulating resin layer 6 is fixed, it is desirable that the bottom surface 5B of the molded package 10 in which the bottom surface 8B of the metal plate 8 is exposed should be even, and moreover in order to further prevent generation of voids, it is desirable that the insulating sheet should be fixed to the package 10 in a vacuum.

The distance x shown in FIG. 1 may be asymmetrical (the same applies to the second preferred embodiment and all the variations discussed later).

While all the lead frames are bent in the first preferred embodiment, instead, a plane frame which is so disposed as not to come into contact with the metal plate 8 may be used as the second lead frame 1B though the outer size increases. The former case where the bent lead frames are used as shown in FIG. 1 has an advantage that it is possible to easily ensure the insulation distance between the outer leads and the bottom surface of the package. On the other hand, the latter case where a plane frame is used has an advantage that the cost for frames decreases. Naturally, the variation of the latter case (plane-type second lead frame) may be applied to the first and second variations and the second preferred embodiment and the third and fourth variations thereof.

(The First Variation)

Figure 2:
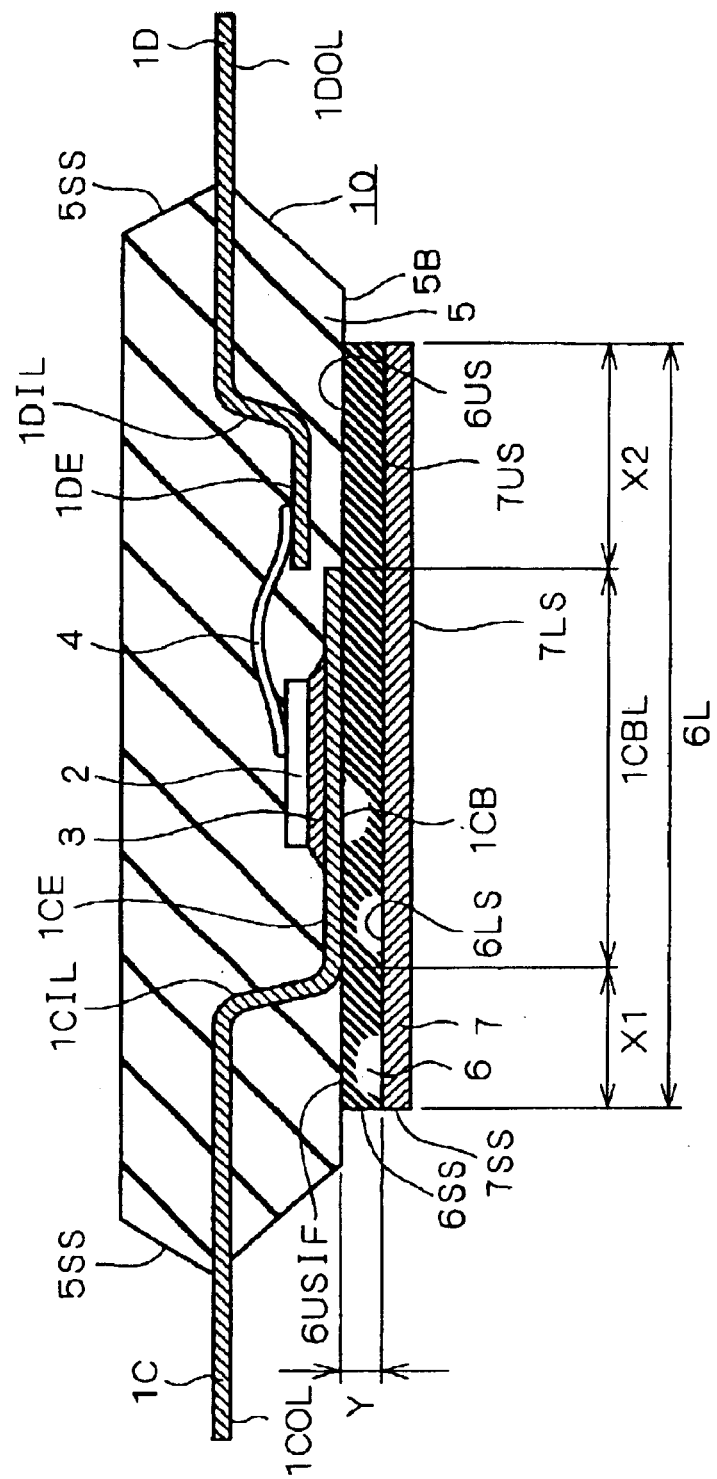
FIG. 2 is a longitudinal section showing a structure of a mold resin-sealed power semiconductor device in accordance with a first variation.

FIG. 2 is a longitudinal section schematically showing a structure of a mold resin-sealed power semiconductor device in accordance with the first variation. The difference between the device of the first variation shown in FIG. 2 and the device of the first preferred embodiment shown in FIG. 1 (the characteristic feature of the first variation) is that a first lead frame 1C of FIG. 2 is used instead of the metal plate 8 of FIG. 1. The first variation is basically the same as the first preferred embodiment except the above feature. Accordingly, the constituent elements of FIG. 2 identical to those of FIG. 1 are represented by the same reference signs. For example, the complex insulating sheet of the metal layer 7 and the insulating resin layer 6 is a constituent member common to FIGS. 1 and 2. The complex insulating sheet of the first variation, however, is fixed onto a bottom surface 1CB of the first lead frame 1C which is exposed from the bottom surface 5B of the package 10. In this case, the relation between the outer size 6L of the upper surface 6US of the insulating resin layer 6 and the outer size 1CBL of the bottom surface 1CB of the first lead frame 1C is 6L>1CBL, like in the first preferred embodiment. The structure of the semiconductor device shown in FIG. 2 is as follows.

The power semiconductor chip 2 is fixed onto a tip portion 1CE (or a pad) of the first lead frame 1C which is, e.g., a Cu frame having a thickness of 0.8 mm with, e.g., the solder layer 3. An electrode (not shown) provided at a tip portion 1DE of a second lead frame 1D which is also a Cu frame having a thickness of 0.8 mm and the electrode (not shown) of the power semiconductor chip 2 are interconnected with, e.g., the aluminum wire 4 having a diameter of 400 μm. These lead frames 1C and 1D, the power semiconductor chip 2, the solder layer 3 and the aluminum wire 4 are sealed with the mold resin 5 made of an epoxy resin containing a filler of silica at a percentage of about 70% so that only the bottom surface 1CB of the first lead frame 1C can be exposed, and the mold resin 5 forms the package 10 of the present semiconductor device. Further, the insulating resin layer 6 made of, e.g., an epoxy resin containing alumina powder as the inorganic filler at a percentage of 50% is disposed on the bottom surface 1CB of the first lead frame 1C, being in surface-to-surface contact therewith, and directly fixed to the lead frame 1C. The metal layer 7 made of e.g., a Cu foil having a thickness of about 100 μm is fixed onto an opposite surface of the insulating resin layer 6, being in surface-to-surface contact therewith. Therefore, also in the device of the first variation, the metal layer 7 serves as a surface of the power semiconductor device to be in surface-to-surface contact with the outside radiating fin (not shown).

A method of manufacturing the power semiconductor device of the first variation is as follows. First, the power semiconductor chip 2 is fixed onto a pad of the first lead frame 1C with, e.g., the solder layer 3, and the electrode on the upper surface 2US of the power semiconductor chip 2 and the electrode provided on the second lead frame 1D are interconnected with the aluminum wire 4. Next, a complex consisting of the first and second lead frames 1C and 1D, the power semiconductor chip 2, the solder layer 3 and the aluminum wire 4 is disposed inside a predetermined mold die (not shown), and the inside of the mold die is filled with the mold resin 5, and mold-resin sealing is performed so that only the bottom surface 1CB of the first lead frame 1C can be exposed. In this case, in order to reduce the thermal resistance, these lead frames 1C and 1D have the step structure as shown in FIG. 2. It is preferable for reduction of thermal resistance that a back surface of the first lead frame 1C should be entirely exposed from the mold resin 5. Next, the insulating sheet which is a complex of the metal layer 7 and the insulating resin layer 6 is so disposed as to be superimposed on the exposed bottom surface 1CB of the molded first lead frame 1C, and then a pressure is applied to the insulating sheet under heating to fix the insulating sheet to the exposed bottom surface 1CB and the interface 6USIF.

Thus obtained is the structure where the radiating surface 1CB of the first lead frame 1C is covered with the insulating resin layer 6 and moreover the insulating resin layer 6 is entirely protected by the metal layer 7.

In order to prevent bubbles from entering the interface to which the insulating resin layer 6 is fixed, it is preferable that the main surface or the bottom surface 5B of the molded package 10 should be even, and in order to further prevent generation of voids, it is preferable that the insulating sheet should be fixed in a vacuum.

It is natural that the first variation can produce the effects of the first preferred embodiment.

(The Second Variation)

It is possible in the mold resin-sealed power semiconductor device of FIG. 1 to change the outer size of the insulating sheet so that the relation $6L \leqq 8L$ can be held. Specifically, the upper surface 6US of the insulating resin layer 6 is fixed only onto the bottom surface 8B of the metal plate 8. Though it is sure that the second variation can produce the basic effects of the first preferred embodiment, the second variation contrarily produces the following disadvantages. Specifically, since the creepage insulation distance (this distance is a parameter giving an index to ensure insulation between the heat sink 8 and the outside radiating fin) is represented by the distance y in the second variation while the creepage insulation distance in the device of FIG. 1 is represented by the distance (x+y) which is longer than the above one, the withstand voltage characteristics of the second variation is deteriorated as compared with the device of FIG. 1. If this point is overlooked, the second variation can provide an effective embodiment.

Similarly, the essence of the second variation can be applied to the device of the first variation shown in FIG. 2 (its creepage insulation distance is x1+y, x2+y). In this case, the relation is $6L \leqq 1CBL$.

(The Second Preferred Embodiment)

Figure 3:
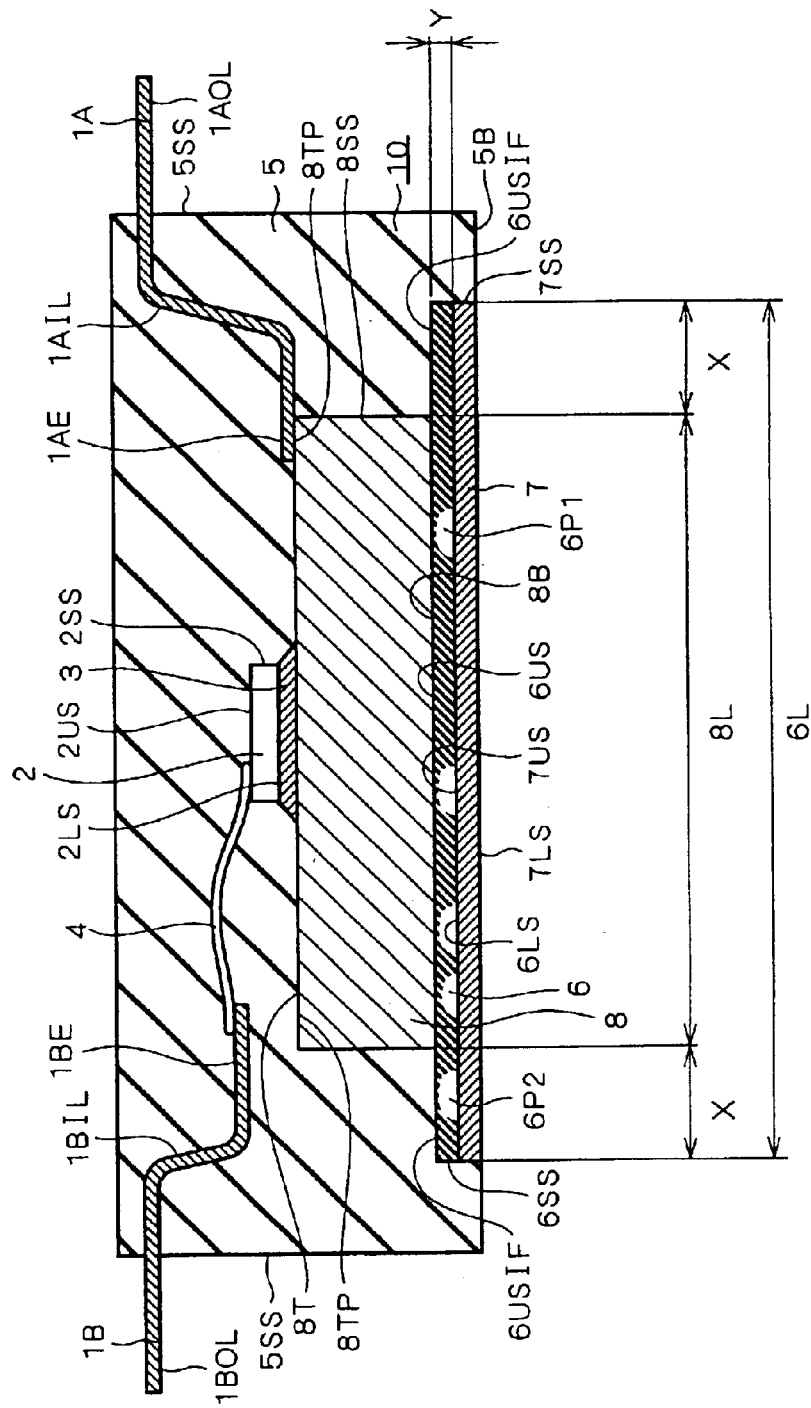
FIG. 3 is a longitudinal section showing a structure of a mold resin-sealed power semiconductor device in accordance with a second preferred embodiment.

FIG. 3 is a longitudinal section schematically showing a structure of a mold resin-sealed power semiconductor device in accordance with the second preferred embodiment. The structural difference between the device of the second preferred embodiment shown in FIG. 3 and the device of the first preferred embodiment shown in FIG. 1 is that the complex insulating sheet (the united complex in which the insulating resin layer 6 is layered on the metal layer 7) is included in the package 10 except the exposed bottom surface (which corresponds to the lower surface 7LS of the metal layer 7), and the second preferred embodiment is basically the same as the first preferred embodiment except the above difference. Accordingly, the constituent elements of FIG. 3 identical to those of FIG. 1 are represented by the same reference signs (detailed description on the constituent elements with the same reference signs is referred to the corresponding description of the first preferred embodiment). For example, the insulating sheet which is a complex of the metal layer 7 and the insulating resin layer 6 is basically manufactured by the method discussed with reference to FIG. 1 (accordingly, discussion on the manufacturing method of the insulating sheet of the second preferred embodiment is referred to the discussion in the first preferred embodiment). As discussed later, however, the components of the inorganic filler in the insulating resin layer 6 which is a constituent element of the insulating sheet of the second preferred embodiment has a remarkable characteristic feature.

The summary of the characteristic features or merkmal of the semiconductor device of the second preferred embodiment shown in FIG. 3 is as follows.

i) The insulating resin layer 6 which is reinforced by the metal layer 7 such as a Cu foil to ensure easier handling is provided on the side of the bottom surface 8B of the heat sink 8.

ii) During the period while the liquid mold resin 5 which is implanted into the cavity of the mold die to fill the whole cavity in forming the package by molding is gelated and hardened (for example, it takes about 2 to 3 minutes to harden the mold resin 5 under application of heat of 180° C.), fixing between the unhardened insulating resin layer 6 and the bottom surface 8B of the heat sink 8 and hardening of the unhardened insulating resin layer 6 are completed almost at the same timing as hardening of the mold resin 5 by actively using the pressure applied from the mold resin 5 itself on the way of hardening. In this case, since the pressure applied to a portion 6P1 of the insulating resin layer 6 which is positioned immediately below the interface 8B from the metal plate 8 on the basis of the weight of the metal plate 8 is negligible as compared with the pressure applied to the portion 6P1 of the insulating resin layer 6 through the metal plate 8 from the mold resin 5 under hardening which is positioned over the main surface 8T of the metal plate 8, the pressure applied to the portion 6P1 of the insulating resin layer 6 through the metal plate 8 from the mold resin 5 under hardening which is positioned over the main surface 8T of the metal plate 8 is almost equal to the pressure applied to a portion 6P2 of the insulating resin layer 6 from the mold resin 5 under hardening which is positioned over the portion 6P2 of the insulating resin layer 6 positioned outside the interface 8B. In other words, the insulating resin layer 6 under hardening is hardened while receiving the uniform pressure applied from the mold resin 5 under hardening which fully fills the inside of the cavity. Therefore, as the result of application of the uniform pressure, since the voids which remain in the insulating resin layer 6 are released into the mold resin 5 under hardening during the period until the whole insulating resin layer 6 is fully hardened, the insulating characteristics of the insulating resin layer 6 increases and the withstand voltage value of the semiconductor device of the second preferred embodiment increases. For example, the value of mold resin implantation pressure which is kept applying in the mold cavity is $9.8 \times 10^6$ Pa in the period while implantation of the liquid mold resin 5 into the mold cavity is started, the mold resin 5 fills the whole cavity and then the liquid mold resin 5 is hardened while being heated. By uniform application of the mold resin implantation pressure, the insulating resin layer 6 becomes evenly thinner when hardened, as compared with the unhardened one (reduction in thermal resistance of the insulating resin layer 6).

iii) The insulating resin layer 6 comprises "thixotropy" which is a physical property to present no fluidity under a relatively low pressure and present fluidity under a relatively high pressure as the result of improvement in grain shape of the inorganic filler mixed in the raw material of insulating resin. Specifically, the insulating resin layer 6 comprises at least one kind of inorganic filler out of a scale-like inorganic filler, a needle-like inorganic filler and an inorganic filler having hyperfine grains whose outside diameter is 1 μm or less. This avoids fluidity of the insulating resin layer 6 while ensuring the wettability thereof in fixing the insulating resin layer 6 to the heat sink bottom-surface 8B under a relatively low pressure. Moreover, since the inorganic filler of scale-like shape or the like is used, the contact between the fillers is almost a surface-to-surface contact, as compared with a case where a general spheral or crushed inorganic filler is used (in this case, the contact between the fillers is almost a point-to-point contact), and as a result, the area of contact increases and it is therefore possible to easily reduce the contact thermal resistance without increasing the packing fraction of filler so much, in other words, possible to effectively increase the thermal conductivity of the insulating resin layer 6.

iv) The size 6L of the upper surface 6US of the insulating resin layer 6 is set larger than the size 8L of the bottom surface 8B of the metal plate 8 (6L>8L) so that the upper surface 6US of the insulating resin layer 6 can entirely include the interface (8B) between the insulating resin layer 6 and the metal plate 8, and moreover the size of the upper surface of the metal layer 7 is set equal to the size 6L of the lower surface of the insulating resin layer 6. This ensures the relatively long creepage discharge distance (x+y) to improve the withstand voltage characteristics and allows the surrounding mold resin 5 to effectively prevent the insulating resin layer 6 from flowing to create a swell therein in fixing the upper surface 6US of the insulating resin layer 6 to the bottom surface 8B of the heat sink 8 under a relatively high pressure.

Detailed discussion will be made below on the mold resin-sealed power semiconductor device of the second preferred embodiment with reference to FIG. 3.

As shown in FIG. 3, the tip portion 1AE of the first lead frame 1A is fixed onto the peripheral portion 8TP of the main surface 8T of the metal plate (or heat sink) 8, and the power semiconductor chip 2 is fixed with, e.g., the solder layer 3 on the substantial center portion of the main surface 8T of the metal plate 8. The electrode (not shown) provided at the tip portion 1BE of the second lead frame 1B and the electrode (not shown) on the upper surface 2US of the power semiconductor chip 2 are interconnected with, e.g., the aluminum wire 4 having a diameter of 400 µm. The insulating resin layer 6 is disposed, being in contact with the bottom surface 8B of the metal plate 8, and the metal layer 7 is disposed on the lower surface 6LS of the insulating resin layer 6. The mold resin 5 so covers the first and second inner lead portions 1AIL and 1BIL, the metal wire 4, the upper surface 2US and the side surfaces 2SS of the power semiconductor chip 2, the conductive layer 3, the main surface 8T and the side surfaces 8SS of the metal plate 8, the outer portion 6USIF in the upper surface 6US of the insulating resin layer 6 which is positioned outside the interface between the insulating resin layer 6 and the metal plate 8, the side surfaces 6SS of the insulating resin layer 6 and the side surfaces 8SS of the metal plate 8 as to fully contain these elements, to thereby form the package 10 of the second preferred embodiment. Therefore, in the second preferred embodiment, the lower surface 7LS of the metal layer 7 is entirely exposed outside and the exposed lower surface 7LS forms part of the bottom surface 5B of the package 10.

<Manufacturing Method>

Figure 4:
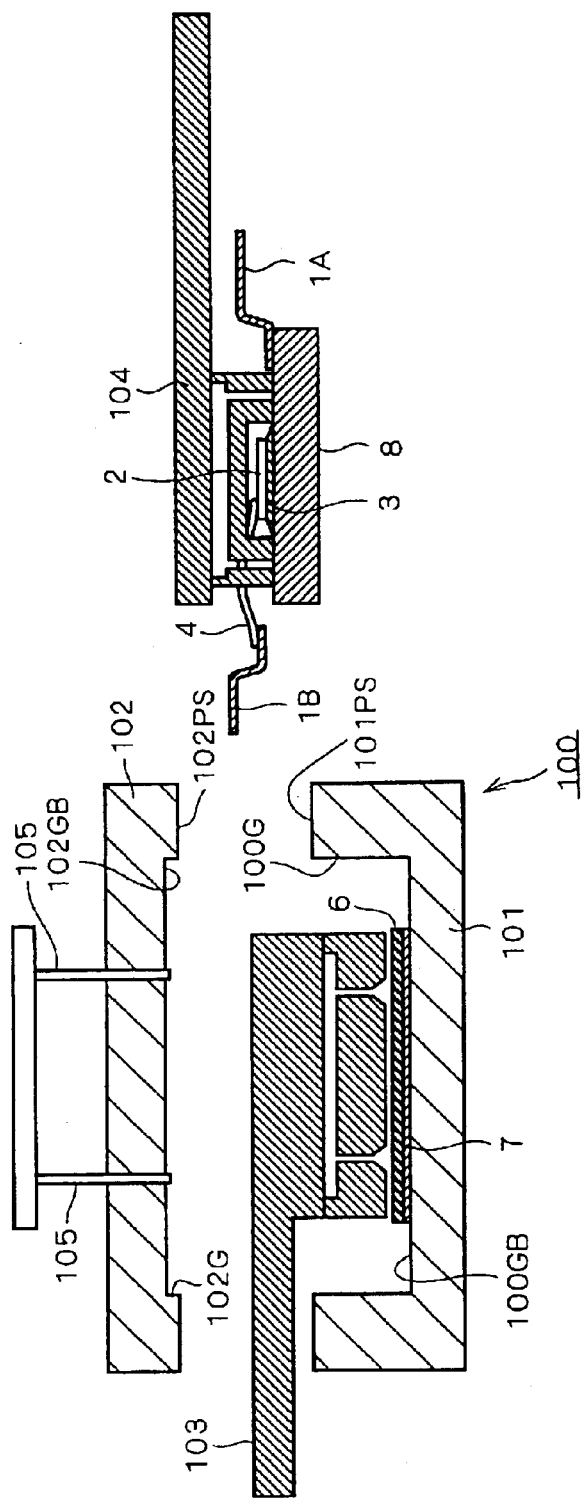
FIGS. 4 to 6 are longitudinal sections showing process steps of manufacturing the mold resin-sealed power semiconductor device in accordance with the second preferred embodiment.
Figure 5:
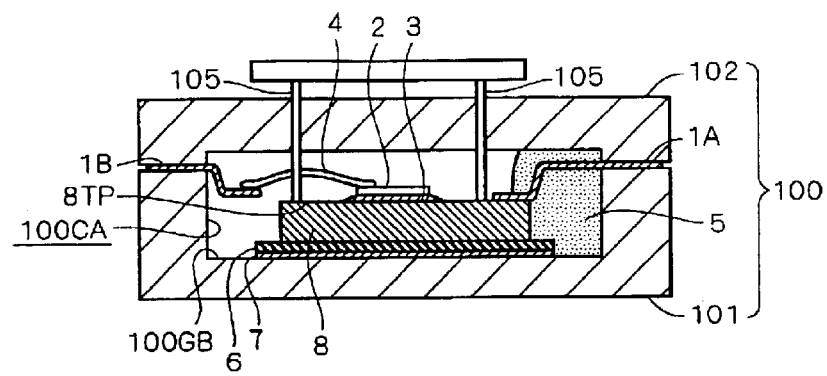
Figure 6:
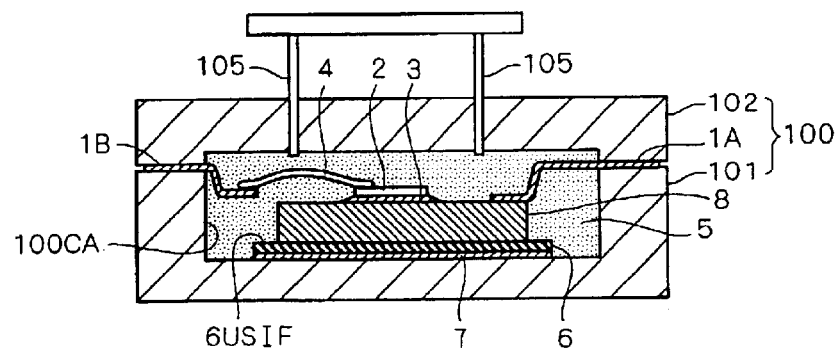

The adhesion between the insulating resin layer 6 and the metal plate 8 can be ensured by an exemplary manufacturing method shown in the longitudinal sections (process drawing) of FIGS. 4 to 6. Discussion will be made below on the exemplary method of manufacturing the device shown in FIG. 3.

Step 1) The insulating sheet (7+6) is disposed at a predetermined position in the mold die and the lower surface 7L of the metal layer 7 is brought into surface-to-surface contact with the bottom surface of the cavity of the mold die. The detail of the process is as follows.

As shown in FIG. 4, a mold die 100 consists of a drag 101 and a cope 102, and the outer shape of a cavity 100CA (see FIG. 5) formed by clamping the drag 101 and the cope 102 with a mold press (not shown) defines the outer shape of the package 10 shown in FIG. 3. First, the insulating sheet which is a united complex of the unhardened insulating resin layer 6 and the metal layer 7 is formed in advance by the manufacturing method discussed in the first preferred embodiment. Then, an adsorption positioning device 103, for example, is used to adsorb the insulating sheet onto the adsorption positioning device 103 in a vacuum, and under adsorption, the adsorption positioning device 103 is transferred to a predetermined position in a groove 100G provided in the drag 101 and subsequently lowered to dispose the insulating sheet in the predetermined position of the groove 100G so that the lower surface 7LS of the metal layer 7 can come into surface-to-surface contact with a bottom surface 100GB of the groove 100G. After that, the adsorption positioning device 103 is transferred outside the mold die 100.

Step 2) In the mold die 100, the metal plate 8 serving as a heat sink which comprises the main surface 8T on which the power semiconductor chip 2 is mounted and the bottom surface 8B opposed to the main surface 8T in a direction of its thickness is disposed on a surface of the insulating sheet, to bring the bottom surface 8B of the metal plate 8 into surface-to-surface contact with the upper surface 6US of the unhardened insulating resin layer 6. The detail is as follows.

An inner structure consisting of the metal plate 8, the soldered power semiconductor chip 2, the first and second lead frames 1A and 1B and the aluminum wire 4 is held by a frame transfer positioning device 104, as shown in FIG. 4, and the frame transfer positioning device 104 is transferred towards the drag 101, to dispose the inner structure at a predetermined position of the groove 100G in the drag 101. The bottom surface 8B of the metal plate 8 thereby comes into surface-to-surface contact with the upper surface 6US of the unhardened insulating resin layer 6, being superimposed on one another, in the groove 100G of the drag 101. In other words, the inner structure is disposed on the insulating sheet (see FIG. 5). After that, the frame transfer positioning device 104 is transferred outside the mold die.

Step 3) The liquid mold resin 5 is implanted into the cavity 100CA of the mold die 100 with a constant implantation pressure at a predetermined temperature while a constant pressure is applied to the insulating sheet from the metal plate 8. The detail is as follows.

The cope 102 is transferred to the drag 101 by a mold press and a projection surface 102PS of the cope 102 and a projection surface 101PS of the drag 101 are superimposed on one another while sandwiching the first and second outer lead portions 1AOL and 1BOL therebetween. The grooves 100G and 102G thereby form the cavity 100CA including the insulating sheet, the metal plate and the like. Next, as shown in FIG. 5, the tip of a retaining pin 105 which is inserted into a through hole of the cope 102, being vertically movable, is transferred downwards into the cavity 100CA, to come into contact with the peripheral portion 8TP (which corresponds to the periphery of a surface in the main surface 8T on which the power semiconductor chip 2 is mounted) of the main surface 8T of the metal plate 8 with nothing mounted thereon. In this state, the retaining pin 105 is pressed by a pressing mechanism (not shown). The value of pressure applied by the retaining pin 105 is, e.g., about $4.9 \times 10^5$ Pa. The tip of the retaining pin 105 thereby presses the metal plate 8 along a direction of thickness of the metal plate 8, and consequently the bottom surface 8B of the metal plate 8 presses the unhardened insulating resin layer 6 through the upper surface (interface) 6US which is a contact surface immediately below the bottom surface 8B of the metal plate 8. Next, while the retaining pin 105 applies such a pressure as above (a predetermined pressure) and the mold die 100 is always kept at a predetermined temperature (e.g., 180° C.) by heating, the mold resin 5 which is liquid at this time is continuously implanted into the cavity 100CA (see FIG. 5). Though the mold resin implantation pressure which can be applied at that time depends on the capability of the mold die 100 to determine the number of packages which can be produced from one mold die, the mold resin implantation pressure that the present inventors use in an exemplary embodiment is about $9.8 \times 10^6$ Pa. In this implantation process, with the first pressure applied from the retaining pin 105 (the main pressure in this stage) and a second pressure further applied from the implanted liquid mold resin 5 (negligible in this stage because the implanted mold resin 5 is still liquid), the metal plate 8 is pressed against a wall surface (the bottom surface of the groove of the drag 101) of the cavity 100CA through the insulating sheet consisting of the insulating resin layer 6 and the metal layer 7. At that time, preferably, in order to avoid generation of voids, the air in the cavity 100CA is exhausted by a vacuum pump.

Step 4) After the whole cavity 100CA is filled with the mold resin 5, the first pressure from the retaining pin 105 is stopped and then the unhardened mold resin 5 and the unhardened insulating resin layer 6 are hardened at the same time for a certain period of time (e.g., about 2 to 3 minutes) through heating (at a predetermined temperature (e.g., 180° C.). The detail is as follows.

After the whole cavity 100CA is almost fully filled with the mold resin 5, the implantation of the mold resin 5 is stopped (though the mold resin implantation pressure of, e.g., about $9.8 \times 10^6$ Pa still continues to be applied until hardening of the mold resin 5 is completed) and the tip of the retaining pin 105 is raised till the level of the upper surface 102GB of the cavity in the cope 102 (see FIG. 6). At that time, the timing of drawing the retaining pin 105 is until the time of the gelation of the mold resin 5 (some time on the way of hardening the mold resin 5). If the retaining pin 105 is drawn out until the time of the gelation of the mold resin 5, it is possible to effectively prevent the mold resin 5 from entering the interface between the bottom surface 8B of the metal plate 8 and the upper surface 6US of the insulating resin layer 6 and therefore the adhesion between these surfaces 8B and 6US increases. Moreover, timely drawing of the retaining pin 105 during hardening of the mold resin 5 contributes to prevention of exposure of part of the metal plate 8 (e.g., the main surface 8T) and produces an effect of preventing the mold resin 5 from locally having thinner portions to uniformize the thickness of the hardened mold resin 5. As a result, the reliability in insulating characteristics of the device increases. After the retaining pin 105 is drawn out, by keeping the predetermined temperature (e.g., 180° C.) under continuous heating of the mold die 100, the second pressure applied from the mold resin 5 under hardening which continuously receives the implantation pressure of, e.g., $9.8 \times 10^6$ Pa continues to be uniformly applied to the insulating resin layer 6 during the period of hardening the mold resin 5, without the first pressure applied from the retaining pin 105. With the uniform second pressure, the thickness of the insulating resin layer 6 under hardening is slightly thinned uniformly on the whole of layer, and at that time, the voids remaining in the insulating resin layer 6 are released out in the mold resin 5. Therefore, the insulating characteristics of the insulating resin layer 6 increases and the withstand voltage characteristics of the device is improved. Then, the second pressure applied from the mold resin 5 continues to be applied to the insulating resin layer 6 at the predetermined temperature, to allow the layer of the mold resin 5 and the insulating resin layer 6 to be hardened at almost the same time, and as a result, formation of the package 10 and the fixing of the bottom surface 8B of the metal plate 8 and the upper surface 6US of the insulating resin layer 6 are achieved at the same time.

After the cavity 100CA is formed by closing the mold die 100, it is desirable to exhaust the air in the cavity 100CA by a vacuum pump or the like, in order to reduce remaining bubbles in the fixing interface and the mold resin 5 and accordingly to improve the withstand voltage characteristics of the present device.

Special mention will be made on the following effect. Specifically, since the pursuit of higher thermal conductivity of the insulating resin layer leads to higher percentage of content of the inorganic filler and the insulating resin layer consequently becomes brittler, in general, it is extremely hard to fix the insulating resin layer with high thermal conductivity to the metal plate without creating any swell in the insulating resin layer. In the method of manufacturing the device of the second preferred embodiment, however, since the fixing of the insulating resin layer 6 and the metal plate 8 and the hardening of the layer of the mold resin 5 are performed at the same time (see FIG. 6) and moreover the mold resin 5 covers the portion 6USIF of the upper surface 6US of the insulating resin layer 6 which is around the fixing surface between the metal plate bottom surface 8B and the insulating resin layer 6, the implantation pressure of the mold resin 5 is transferred to the upper surface 6US of the insulating resin layer 6 through the unhardened liquid mold resin 5. Therefore, even if the pressed insulating resin layer 6 intends to swell along the longitudinal direction, the mold resin 5 covering the portion 6USIF of the insulating resin layer 6 forces down the swelling portion, to prevent the swell or relief of the insulating resin layer 6. As a result, the stress applied to the insulating resin layer 6 simply escapes in a transversal or longitudinal direction. Thus, since the insulating resin layer 6 is gradually hardened while its surroundings are gradually hardened with the mold resin 5 and the fixing of the insulating resin layer 6 and the metal plate 8 and the hardening of the mold resin 5 are completed at the same time, this produces an effect of preventing the swell of the insulating resin layer 6 without chipping off in the insulating resin layer 6 and it therefore becomes possible to ensure the reliability in insulation of the device.

Next, detailed discussion will be made on the characteristic feature that the insulating resin layer 6 of the second preferred embodiment comprises a physical property of thixotropy.

Figures 7, 8:
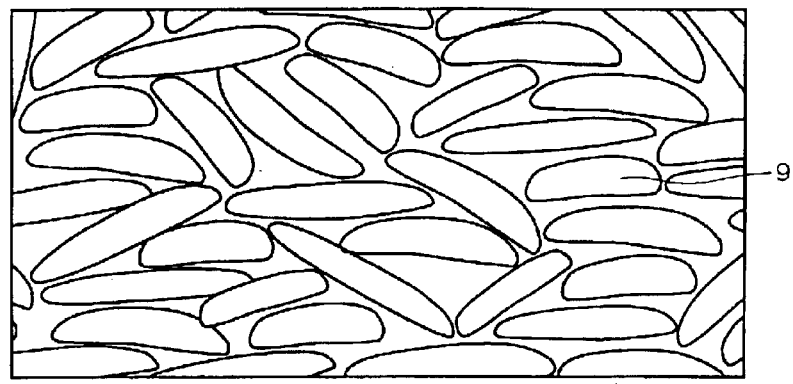
FIG. 7 is a longitudinal section showing a structure of an insulating resin layer in accordance with the second preferred embodiment.
FIG. 8 is a table showing an experimental result on the mold resin-sealed power semiconductor device in accordance with the second preferred embodiment.

FIG. 7 is a longitudinal section schematically showing an inner structure of the insulating resin layer 6 in accordance with the second preferred embodiment. As shown in FIG. 7, oblong inorganic fillers 9 having scale-like grains are contained in an epoxy resin. The reason why such a scale-like inorganic filler 9 is used will be discussed below.

A pressure is applied under heating when the insulating resin layer 6 is fixed to the metal plate 8, and at that time it is necessary to quickly exhaust bubbles entering the bonding interface and air inhering in the insulating resin layer 6. Therefore, in order to ensure highly reliable adhesion between the insulating resin layer 6 and the bottom surface 8B of the metal plate 8, it is necessary to sufficiently wet and spread the insulating resin layer in the interface with the bottom surface 8B of the metal plate 8. In this case, as the viscosity of the insulating resin layer 6 becomes lower, the insulating resin layer 6 can be wet and spread in the interface with the bottom surface 8B of the metal plate 8, and it is therefore desirable that the viscosity of the insulating resin layer 6 should be relatively low.

Generally, the grain shape of the inorganic filler filling the insulating resin layer is spheral or crushed one. In order to ensure the wettability of the insulating resin layer using the inorganic filler of well-known grain shape, it is only necessary to reduce the packing fraction of the inorganic filler. This reduction in packing fraction leads to low viscosity of the insulating resin. When the viscosity of the resin becomes too low, the insulating resin flows by the pressure in fixing and it becomes impossible to sufficiently achieve formation of the insulating resin layer, which is an original object of the present invention. In other words, when the viscosity of the resin is set too low by controlling the packing fraction of the inorganic filler, it is impossible to obtain an insulating resin layer having thermal conductivity and withstand voltage characteristics for practical use.

On the other hand, when the packing fraction of the spheral or crushed inorganic filler is controlled to be too high, the viscosity of the resin excessively increases and it becomes impossible to effectively exhaust bubbles entering the insulating resin and/or air inhering in the insulating resin, and further the wettability of the insulating resin in the interface with the metal plate 8 becomes too bad and it becomes hard to ensure sufficient adhesion.

Therefore, in order not to cause such two problems, it is required that an appropriate resin viscosity should be strictly selected. Since such precise selection of resin viscosity is actually hard, however, in the insulating resin layer using the conventional spheral or crushed inorganic filler, it is impossible to obtain sufficient adhesion without flowing the insulating resin out and this necessarily causes constraints in voltage, electrical power and calorific value which can be utilized in the semiconductor device.

On the other hand, as shown in FIG. 7, by mixing the scale-like inorganic fillers 9 in the insulating resin layer 6, the insulating resin layer 6 can develop the physical property of "thixotropy not presenting fluidity under a relatively low pressure and presenting fluidity under a relatively high pressure". In other words, with the insulating resin layer 6 having the thixotropy, it is possible to increase the packing fraction of the inorganic filler and increase the wettability of the insulating resin.

Then, when this thixotropy is utilized, a) in an early stage of implantation where the liquid mold resin 5 is implanted into the cavity 101CA of the mold die by a relatively low implantation pressure, a pressure is continuously applied to the insulating resin layer 6 while maintaining the original thickness and the original shape of the insulating resin layer 6 without flowing the insulating resin layer 6 out, and b) in a subsequent stage where there is no void or the like and the cavity 101CA is filled with the mold resin 5, since a relatively high pressure (which corresponds to the mold resin implantation pressure) is applied to the insulating resin layer 6, if this state is kept for a predetermined period of time under heating, the insulating resin layer 6 presents the fluidity at that time, and the insulating resin layer 6 is hardened while exhausting the bubbles and/or air therein and being wet and spread along the interface with the bottom surface 8B of the metal plate 8. At that time, as discussed above, since the mold resin 5 is present around the portion 6P2 of the insulating resin layer 6 which is projected from the interface with the bottom surface 8B of the metal plate 8 and the mold resin 5 continues to apply a pressure to the projecting portion 6P2 of the insulating resin layer 6, the insulating resin layer 6 does not flows out during the transition of hardening and the mold resin 5 contributes only to (i) exhaustion of the bubbles entering the insulating resin layer 6 or/and the air inhering in the insulating resin layer 6 and (ii) ensuring the wettability of the resin in the interface with the metal plate 8.

The reason why such thixotropy develops is that the surface to volume ratio of the inorganic filler (which corresponds to the surface area of the inorganic filler per volume) is large. Specifically, a large surface to volume ratio leads to a large interaction between the filler and the resin and the viscosity of the whole insulating resin layer thereby increases. Since this interaction, however, can be easily cut off depending on the strength of an external force, when a relatively high pressure is applied, the above interaction is cut off and the insulating resin layer presents the fluidity.

While the foregoing discussion on the second preferred embodiment discloses the case where the insulating resin layer 6 contains the inorganic filler S9 each having a scale-like grain shape, the inorganic filler to develop the thixotropy of the insulating resin layer 6 is not limited to this case. For example, the present inventors confirm that the insulating resin layer 6 develops the same thixotropy also when an inorganic filler having a needle-like grain shape is used. Further, also when both the general spheral or crushed inorganic fillers and the inorganic fillers each having the scale-like or/and needle-like grain shape are used, the insulating resin layer 6 can develop the thixotropy. Other than the above cases, the present inventors confirm that the insulating resin layer 6 can develop the thixotropy also when a hyperfine-grained filler whose average grain diameter is 1 μm or less (smaller grain diameter is better) is mixed in the above general filler at a mass percentage of several tens %. Especially in the case where scale-like inorganic fillers 9 are disposed in parallel with a main surface of the insulating resin layer 6, as schematically shown in FIG. 7, since deformation of the insulating resin layer 6 due to application of a pressure is small and exhaustion of air increases, the present inventors confirm that the structure of FIG. 7 should be a preferable one. The parallel arrangement of FIG. 7 can be achieved by applying the raw material of insulating resin layer with the inorganic fillers 9 mixed therein onto the metal layer 6 and then controlling how to squeeze the raw material of insulating resin layer.

The scale-like or needle-like grain of the inorganic filler 9 can be achieved in advance by control in crystal growth.

The powders of the inorganic fillers 9 whose grains are formed into scale-like or needle-like shape in advance is mixed in the raw material of insulating resin layer, the raw material containing such inorganic fillers 9 is applied onto the upper surface 7US of the metal layer 7 wound across the rollers used in the method of manufacturing the insulating sheet which is discussed in the first preferred embodiment, and after that, the raw material of insulating resin layer is squeezed, thereby being extended in a sheet. This squeezing allows the inorganic fillers 9 in the raw material of insulating resin layer come into almost surface-to-surface contact with one another and the contact area of the inorganic fillers 9 in this case remarkably increases as compared with the contact area of the inorganic fillers having general grain shape. Therefore, the insulating resin layer 6 containing the inorganic fillers 9 having grains of scale-like or needle-like shape or the like produces an effect of achieving higher thermal conductivity, as compared with the insulating resin layer containing only the inorganic fillers having grains of general shape.

Herein, boron nitride, for example, is used as the ingredient of the scale-like inorganic filler 9 and in this case, it is possible to obtain the insulating resin layer 6 which develops the thermal conductivity of about 60 W/mK. Even in a case, however, where the percentage of content or the packing fraction of the scale-like inorganic filler 9 made of boron nitride is set in a range from 40% to 60% which does not deteriorate the productivity, it is possible to obtain the insulating resin layer 6 having the thermal conductivity of about 10 W/mK. Therefore, even the case where the percentage of content of the scale-like inorganic filler 9 is set at low level, such in the range from 40% to 60%, is regarded as a preferable case for actual use. While the ingredient of the scale-like inorganic filler 9 is boron nitride in the above case, other material may be used as the ingredient of the inorganic filler 9 having a scale-like or needle-like grain shape or a hyperfine grain whose average diameter is 1 μm or less, to ensure both desirable withstand voltage and productivity, only if the material can work to develop the thixotropy. For example, silicon nitride, aluminum nitride or alumina can be used as the ingredient of the inorganic filler 9.

As to the percentage of content of the inorganic filler 9, for example, when the mass percentage is about 10%, the thermal conductivity of the insulating resin layer 6 hardly increases, but as the percentage of its content becomes higher, the thermal conductivity of the insulating resin layer 6 increases. When the percentage of content of the inorganic filler 9 increases to over 90%, it is disadvantageously impossible to form the insulating resin layer 6. Within the range, however, where the percentage of content of the inorganic filler 9 causes no problem in productivity of the insulating resin layer 6, it is natural that the percentage of content is not limited to the above range of mass percentage from 40% to 60%.

As discussed above, when the inorganic filler 9 in the insulating resin layer 6 has (1) the grain of scale-like shape, (2) the grain of needle-like shape or (3) the hyperfine grain whose average diameter is 1 μm or less, or has mixture of at least two kinds of the above (1), (2) and (3), it is possible to improve adhesion of the insulating resin layer 6 in fixing as discussed above and further improve the withstand voltage characteristics and the thermal resistance of the insulating resin layer 6.

Next, discussion will be made on the thickness of the metal plate 8. Specifically, when the metal plate 8 is relatively thin, the metal plate 8 has deflection due to the pressure applied from the retaining pin 105 (see FIG. 5), and this consequently causes clearance in the fixing surface between the metal plate 8 and the insulating resin layer 6. The experimental result on such a problem is shown in FIG. 8. As is clear from FIG. 8, if the metal plate 8 is made of Cu, when the thickness of the metal plate is 0.8 mm, there arises poor adhesion between the members 6 and 8. Also when the thickness of the metal plate 8 is 2 mm, there is disadvantageous warp and the judgment result is poor adhesion. In each case, however, where the thickness of the metal plate is set to be 3 mm and 4 mm, there is no poor adhesion and a good interface 8B is achieved. From these experimental results, it is judged that the metal plate 8 needs a thickness of 3 mm or more.

Further, from the viewpoint of thermal resistance, an appropriate thickness of the metal plate 8 is studied. From the result of an experiment that the present inventors made, if the insulating resin layer 6 has thermal conductivity of about 10 W/mK and the power semiconductor chip 2 is 1.5 mm square, for example, the thermal resistance tends to decrease when the thickness of the metal plate 8 is set larger than the thickness of the lead frames 1A and 1B, the value of thermal resistance is the minimum when the thickness of the metal plate 8 is in a range from about 3 mm to 4 mm, and after that, the thermal resistance increases as the thickness of the metal plate 8 becomes larger.

Considering the above experimental results, when an appropriate thickness of the metal plate is judged, first only from the viewpoint of thermal resistance, it is preferable that the thickness of the metal plate 8 should be set larger than at least the thickness of the lead frames 1A and 1B (0.5 mm to 1 mm). Considering the fact, however, that the thermal resistance of the metal plate 8 increases to the considerable level for practical use when the thickness of the metal plate 8 becomes about 5 mm and the results of FIG. 8, the appropriate thickness of the metal plate 8 actually falls within a range not less than 3 mm and less than 5 mm.

Next, the reason why the outer size 6L of the insulating resin layer 6 is set larger than the outer size 8L of the metal plate 8 and the insulating resin layer 6 is disposed, relative to the metal plate 8, so that the upper surface 6US of the insulating resin layer 6 can fully include the interface with the bottom surface 8B of the metal plate 8 will be discussed in consideration of the experimental result.

The withstand voltage characteristics between the metal plate 8 and the metal layer 7 on the back surface of the present semiconductor device is measured on cases where the relation between the size 6L of the insulating resin layer 6 and the size 8L of the metal plate 8 is (A) that the metal plate 8 includes the insulating resin layer 6, (B) that both size are equal, and (C) the insulating resin layer 6 includes the metal plate 8. The measurement result is shown in FIG. 9. It can be understood from FIG. 9 that the withstand voltage characteristics can be remarkably improved with the structure (C) where the insulating resin layer 6 includes the metal plate 8 (6L>8L). Specifically, from the viewpoint of the insulation from the metal plate 8 to the metal layer 7, the creeping discharge which can be caused along the side surfaces 6SS of the insulating resin layer 6 and the interface 6USIF between the insulating resin layer 6 and the mold resin 5 is a path of withstand voltage breakage. Therefore, like in the above cases (A) and (B), in order to achieve the withstand voltage characteristics only with the thickness y of the relatively thin insulating resin layer 6, it is necessary to set the thickness y of the insulating resin layer 6 to be over the creepage insulation distance. In contrast to this, like in the above case (C), if the area of the upper surface 6US of the insulating resin layer 6 is set larger than that of the bottom surface 8B of the metal plate 8, since the sum of the length x of the portion of the insulating resin layer 6 which is projected from the fixing surface and the thickness y of the insulating resin layer 6 is the creepage insulation distance, it is possible to achieve predetermined withstand voltage characteristics without setting the thickness y of the insulating resin layer 6 to be unnecessarily large.

In the case where the area of the upper surface 6US of the insulating resin layer 6 is set larger than that of the bottom surface 8B of the metal plate 8, by applying the second pressure which is high enough to change the thickness y of the insulating resin layer 6 in fixing the insulating resin layer 6 to the metal plate 8, in other words, by continuously applying the mold resin implantation pressure higher than, e.g., about $9.8 \times 10^6$ Pa from the start of implantation until completion of hardening, it is possible to further uniformly reduce the thickness y of the insulating resin layer 6 and achieve reduction in thermal resistance of the insulating resin layer 6 and improvement in insulating characteristics and withstand voltage characteristics of the insulating resin layer 6, and by performing the above fixing process simultaneously with the hardening process of the implanted liquid mold resin 5, it is possible to prevent the swell or damage in the portion of the insulating resin layer 6 around the fixing surface (8B). This point will be discussed below in detail on the basis of experimental results.

As discussed above, in producing the raw material of insulating resin layer, in order to make it possible to easily mix the inorganic filler in the epoxy resin, the viscosity of the raw material of insulating resin layer is reduced by mixing a predetermined solvent in the epoxy resin. For the insulating sheet, however, the solvent is not needed.

Therefore, by heating in the drying process during formation of the insulating sheet, the solvent in the insulating resin layer 6 is volatilized, thereby being removed from the insulating resin layer 6. Though the solvent is volatilized in the drying process (the process of removing the solvent), as a result, a number of spongy voids are scattered in the insulating resin layer 6. Such a number of voids cause deterioration in insulating characteristics or withstand voltage characteristics of the insulating resin layer 6. Therefore, the air (voids) inhering in the unhardened insulating resin layer 6 is expelled in the mold resin 5 around the insulating resin layer 6, as discussed above, since the thickness y of the insulating resin layer 6 is uniformly reduced by the second pressure which is uniformly applied to the whole unhardened insulating resin layer 6 from the mold resin 5 on the way of hardening (i.e., the mold resin implantation pressure applied to the mold die 100). In this case, it seems that uniform reduction in thickness of the insulating resin layer 6 proceeds and the withstand voltage characteristics is improved as the second pressure, i.e., the mold resin implantation pressure, becomes higher. The present inventors verify this point through experiments.

FIG. 10 is a table showing a measurement result of withstand voltage in various cases where the insulating sheet using the unhardened insulating resin layer 6 which has the thickness y of, e.g., 200 μm is fixed to the metal plate 8. In Case A of FIG. 10, the insulating sheet consisting of the insulating resin layer 6 having a thickness of 200 μm and the metal layer 7 is fixed onto the bottom surface 8B of the metal plate 8 by applying a pressure in advance and then the metal plate 8 with the insulating sheet is disposed in mold cavity 100CA and molding is performed by applying the mold resin implantation pressure of $9.8 \times 10^6$ Pa. On the other hand, in Cases B to D, the package 10 is molded by using the manufacturing method of the second preferred embodiment, and the mold resin implantation pressures are different by cases. As is clear from the measurement result of FIG. 10, Case A results in faulty withstand voltage indicating about 2 kV. Moreover, in Case A, there are swells of the insulating resin layer 6 in molding. On the other hand, in the semiconductor devices (Cases B to D) manufactured by using the method of the second preferred embodiment, even when the mold resin implantation pressure is smaller than that of Case A, the withstand voltage (5 kV) larger than that of Case A is obtained (in Case B), and moreover good result is achieved that the withstand voltage characteristics increases as the mold resin implantation pressure becomes higher (in Cases C and D). From this measurement result, in Case C that is a preferable one in terms of performance of mold die which is usually used in consideration of productivity, the thickness y of the hardened insulating resin layer 6 is reduced by about 10 μm as compared with the thickness before hardening. Then, in a case where the mold resin 5 is hardened while a larger mold resin implantation pressure, e.g., about $1.274 \times 10^7$ Pa is applied to the mold die, depending on the strength of the mold die, uniform reduction in the thickness y of the insulating resin layer 6 which is hardened at the same timing as the hardening of the mold resin 5 is over 10 μm, and more preferable insulating resin layer 6 can be eventually achieved in terms of insulating characteristics, withstand voltage characteristics, thermal resistance and cost for raw material.

As discussed above, in Case A, the portion 6P1 of the insulating resin layer 6 which is positioned under the fixing surface is moved to the periphery of the fixing surface due to the applied high pressure when the insulating resin layer is fixed to the metal plate, and as a result, the portion 6P2 of the insulating resin layer 6 is hardened while swelling. Since the molding process is performed in this state in Case A, the insulating resin layer is partially broken at the portion with the swells in the portion 6P2 of the insulating resin layer 6 and it becomes impossible to ensure insulation in the peripheral portion of the metal plate.

On the other hand, in any of Cases B to D, such a problem as above is not caused. Specifically, in the second preferred embodiment, since the insulating resin layer 6 comprising the upper surface 6US and the lower surface 6LS each of which has an area larger than that of the bottom surface 8B of the metal plate 8 is hardened and fixed by actively using the second pressure (mold resin implantation pressure) applied from the mold resin 5 which is implanted in the cavity 100CA, it is possible to improve the through insulating characteristics and ensure the required creepage insulation distance (x+y) while the thickness y of the insulating resin layer 6 is controlled to be the minimum value (the thermal resistance of the insulating resin layer 6 can be reduced as the thickness y becomes smaller). Therefore, it is possible to achieve a predetermined withstand voltage characteristics while reducing the thermal resistance of the present semiconductor device to the minimum.

Thus, the above result is obtained that the insulating characteristics (withstand voltage characteristics) is improved when the fixing between the insulating resin layer 6 and the metal plate 8 is performed simultaneously with the molding and the outer size of the insulating resin layer 6 is larger than that of the metal plate 8.

Though it takes a period of time to some degrees to fully harden the unhardened insulating resin layer 6 even in the second preferred embodiment, since the process time is relatively shorter as compared with the case where process steps of fixing the insulating resin layer to the metal plate and hardening the insulating resin layer and a process step of hardening the mold resin 5 (forming the package) are separately performed and particularly in the second preferred embodiment, since a history of temperature occurs only during the implantation of the mold resin 5 and the fixing, it is possible to further increase the productivity.

As to the thickness of the metal layer 7, though the cost in layering the metal layer 7 and the insulating resin layer 6 is reduced as the thickness is smaller, since there actually occurs a problem such as breakage or the like when the thickness is 50 μm or less, it is desirable that the thickness should be about 100 μm.

As discussed above, the second preferred embodiment allows the insulating resin layer 6 to develop the physical property of thixotropy and increases the thermal conductivity of the insulating resin layer 6 by performing the fixing between the metal plate 8 and the insulating resin layer 6 whose size is larger than that of the metal plate 8 and the mold-sealing at the same time and using the inorganic filler 9 which has a scale-like or needle-like grain or a hyperfine grain or a mixture of any ones of these. Moreover, the insulating resin layer 6, which is originally extremely brittle, is reinforced by the metal layer 7 by uniting the insulating resin layer 6 and the metal layer 7. These improvements allow the sheet-like insulating resin layer 6 to be disposed at a predetermined position along the bottom surface of the mold die without its insulating characteristics. Additionally, since it is possible to reduce the thickness of the insulating resin layer 6 while improving the withstand voltage characteristics, this point can contribute to cost-reduction of the device and also to improvement in productivity.

Further, also in the device of FIG. 3, the size and arrangement of the insulating resin layer 6 and the metal plate 8 may be determined so that the relation 6L≦8L is satisfied, like in the second variation, though this variation raises some disadvantages on the withstand voltage characteristics.

If the insulating resin layer 6 having thixotropy which is proposed in the second preferred embodiment is used, in the process of fixing the insulating resin layer 6 to the metal plate 8, it is possible to suppress deformation of the insulating resin layer 6, moreover prevent deterioration of the insulating resin layer 6 even under sufficient pressure, and additionally improve the withstand voltage characteristics of the insulating resin layer 6.

(The Third Variation)

Figure 11:
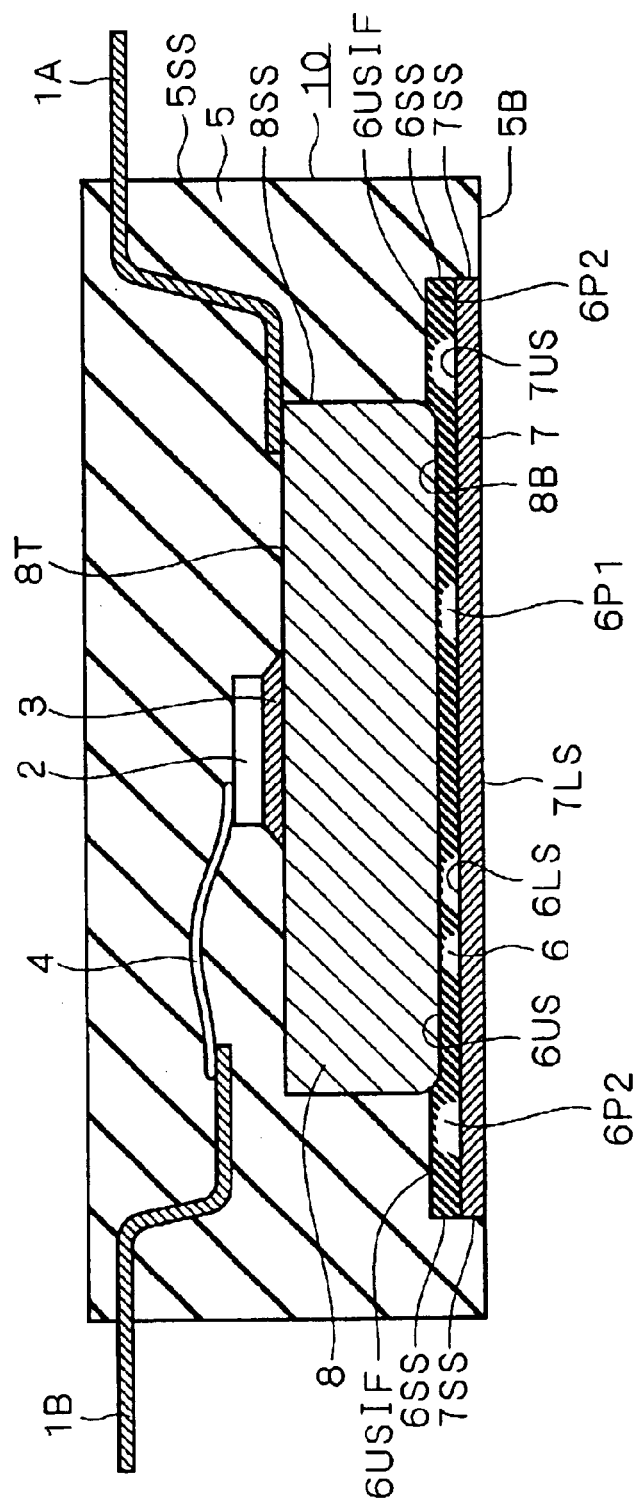
FIG. 11 is a longitudinal section showing a structure of a mold resin-sealed power semiconductor device in accordance with a third variation.

FIG. 11 is a longitudinal section showing a structure of a mold resin-sealed power semiconductor device in accordance with the third variation. The difference between the device of the third variation and the device of the second preferred embodiment, i.e., the characteristic feature of the third variation, is that the first portion 6P1 of the insulating resin layer 6 which is positioned under the interface (8B) between the insulating resin layer 6 and the metal plate 8 is set thinner than the second portion 6P2 of the insulating resin layer 6 which is positioned under the outer portion 6USIF in the upper surface 6US of the insulating resin layer 6 which is positioned outside the interface (8B) between the insulating resin layer 6 and the metal plate 8. Specifically, the thickness of the first portion 6P1 positioned immediately below the fixing surface 8B is smaller than that of the second portion 6P2 positioned outside the fixing surface 8B. In FIG. 11, other constituent elements are the same as the corresponding elements in the second preferred embodiment and are accordingly represented by the same reference signs as those of FIG. 3.

Figure 12:
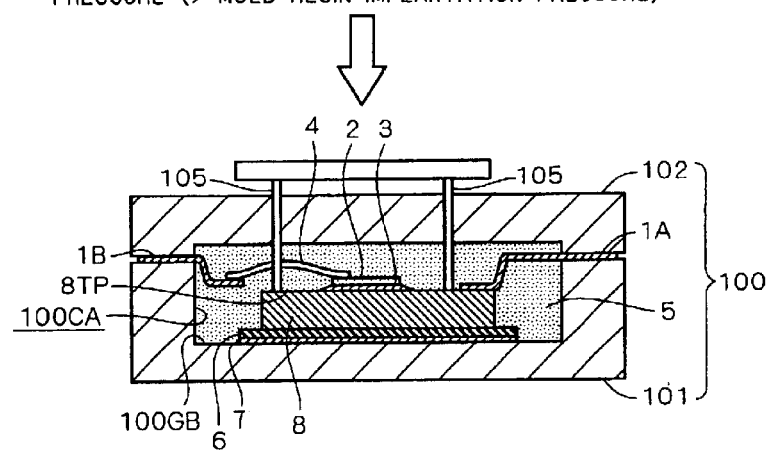
FIG. 12 is a longitudinal section showing a process step of manufacturing the mold resin-sealed power semiconductor device in accordance with the third variation.

FIG. 12 is a longitudinal section showing one of the process steps of manufacturing the structure of FIG. 11. The process step of FIG. 12 corresponds to a step additionally inserted between FIG. 5 and FIG. 6. Specifically, when the liquid mold resin 5 fills the whole cavity 100CA, instead of drawing the retaining pin 105 immediately, a pressure which is larger than the present mold resin implantation pressure (e.g., $9.8 \times 10^6$ Pa), e.g., $1.47 \times 10^7$ Pa to $1.96 \times 10^7$ Pa, is once applied to the retaining pin 105 by a pressing mechanism (not shown) connected to the retaining pin 105 immediately before drawing. This allows a pressure larger than the present mold resin implantation pressure (e.g., $9.8 \times 10^6$ Pa) to be momentarily applied to the insulating resin layer 6 locally, i.e., at the first portion 6P1 positioned immediately below the interface 8B, and as a result, the first portion 6P1 becomes thinner than the second portion 6P2 by the amount corresponding to the applied pressure. After that, immediately, the application of the pressure is stopped and the retaining pin 105 is drawn out from the mold resin 5 which starts being hardened. The state at the time when the retaining pin 105 is drawn out is the same as the state of FIG. 6. The hardening process after that is the same as that in the second preferred embodiment.

Thus, in the third variation, the first portion 6P1 positioned under the fixing surface 8B is made thinner than the peripheral portion 6P2 around the fixing surface 8B by applying the pressure larger than the present mold resin implantation pressure to the first portion 6P1 of the insulating resin layer 6 at the start of hardening of the insulating resin layer 6 and the mold resin 5 or immediately before this start point. Therefore, the third variation produces an effect of further increasing the amount of bubbles inhering in the unhardened insulating resin layer 6 to be exhausted, as compared with the second preferred embodiment, and accordingly further improving the withstand voltage characteristics.

Further, the structure of the third variation also produces an effect of further improving the adhesion between the surface 6USIF of the insulating resin layer 6 and the surface of the mold resin 5 with the swell of the insulating resin layer 6 (the second portion 6P2) around the fixing surface.

Thus, it is possible to further improve the withstand voltage characteristics and the adhesion of the insulating resin layer 6 without unnecessarily thickening the insulating resin layer 6 by applying a pressure locally to the portion 6P1 of the insulating resin layer 6 which is positioned immediately below the fixing surface until the thickness of the portion 6P1 of the insulating resin layer 6 becomes smaller than that of the portion 6P2 of the insulating resin layer 6 around the fixing surface when the fixing between the insulating resin layer 6 and the metal plate 8 and the mold-sealing are performed at the same time.

(The Fourth Variation)

Figure 13:
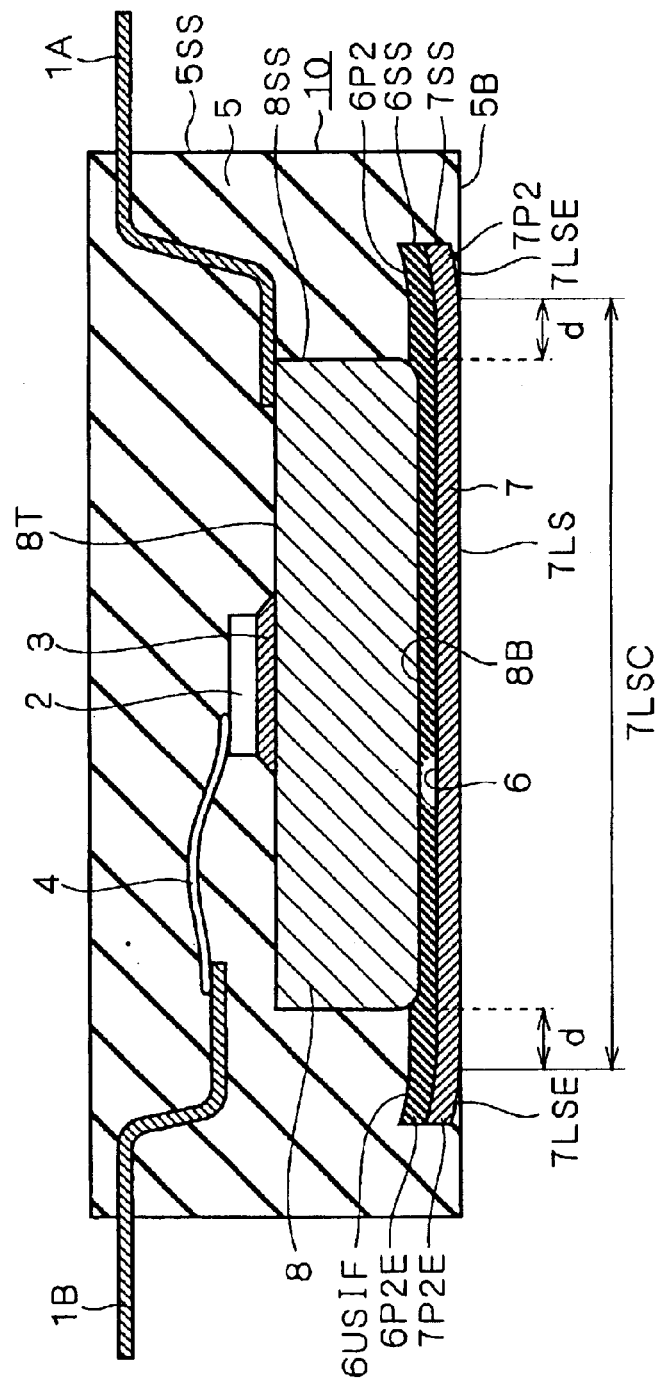
FIG. 13 is a longitudinal section showing a structure of a mold resin-sealed power semiconductor device in accordance with a fourth variation.

FIG. 13 is a longitudinal section showing a structure of a mold resin-sealed power semiconductor device in accordance with the fourth variation. The difference of the fourth variation from the second preferred embodiment and the third variation is that a second portion end 6P2E of the insulating resin layer 6 and an end portion 7P2E of the peripheral portion 7P2 of the metal layer 7 which is fixed to the second portion 6P2 are bent towards the inside of the mold resin 5 as a unit and only a bottom surface portion 7LSC in the lower surface 7LS of the metal layer 7 which includes a center portion positioned immediately below the interface between the insulating resin layer 6 and the metal plate 8, other than a bent lower surface portion 7LSE included in the peripheral portion end 7P2E, is exposed outside. Other constituent elements are the same as the corresponding elements of the third variation.

There may be a case where the whole second portion 6P2 and the whole peripheral portion 7P2 are bent towards the inside the of the mold resin 5 (the distance d=0), and in this case, the lower surface portion which is exposed outside is only the center portion positioned immediately below the interface between the insulating resin layer 6 and the metal plate 8.

While FIG. 13 shows an exemplary case where the characteristic feature of the fourth variation is applied to the device of the third variation, it is naturally possible to apply the fourth variation to the device of FIG. 3 which is an example of the second preferred embodiment.

Since the adhesive strength between the insulating resin layer 6 and the mold resin 5 is weaker than that between the metal plate 8 and the mold resin 5, there is a problem that the long-term reliability of the product depends on the adhesive strength of the interface between the insulating resin layer 6 and the mold resin 5. Since the end portion 6P2E of the insulating resin layer 6 is folded into the surrounding mold resin 5 in the fourth variation, however, the adhesion between the mold resin 5 and the insulating resin layer 6 can be improved with the anchor effect as compared with the devices of FIGS. 3 and 11, and as a result, the present device can have longer-term reliability.

Moreover, in the fourth variation, since the stiffness of the insulating resin layer 6 and the metal layer 7 immediately therebelow becomes higher than that in the case where the end portions 6P2E and 7P2E are flat, it is possible to further improve handling of the insulating sheet.

Additionally, in the device of FIG. 13, since the bend areas in the peripheral portions 7P2 of the metal layer 7 and the peripheral portions 6P2 of the insulating resin layer 6 are formed away from the side surfaces 8SS of the metal plate 8 at a distance d (e.g., a margin of several mm) towards outside, the margin for misregistration in disposing the complex insulating sheet of the insulating resin layer 6 and the metal layer 7 in the mold die 100 (see FIG. 4) becomes larger as compared with the case where the bend surfaces are formed immediately around the side surfaces 8SS of the metal plate 8 (d=0), and this further improves the handling of the complex insulating sheet. In consideration of the increase in margin for positioning, it is preferable that only the end portion 7P2E of the metal layer 7 and the end portion 6P2E of the insulating resin layer 6 should be bent towards the inside of the mold resin 5 like in the device of FIG. 13.

In the case where the portion 6P2 of the insulating resin layer 6 and the portion 7P2 of the metal layer 7 are folded slantwise into the mold resin 5, the creepage distance becomes longer as compared with the case where both the portion 6P2 of the insulating resin layer 6 and the portion 7P2 of the metal layer 7 are unfolded horizontally (cases of FIGS. 3 and 11), and the insulating characteristics can be further improved. On the other hand, in the case where the creepage distance of the present device is set equal to that in the devices shown in FIGS. 3 and 11, it becomes possible to reduce the outer size of the device of the fourth variation as compared with the devices of FIGS. 3 and 11.

Further, the fourth variation can produce an effect of preventing the moisture in the outside air from entering the present device and causing a malfunction of the power semiconductor chip 2 when the present device is used in relatively humid surroundings for the long term. Specifically, there are two routes for infiltration of the moisture in the outside air into the present device to the power semiconductor chip 2, i.e., a route of infiltration through a detachment portion in interface between the insulating sheet and the mold resin 5 which is caused by a long-term use and a route of infiltration through a crack in the interface between the first lead frame 1A and the mold resin 5 which is caused by a long-term use. The countermeasures against the latter route is conventionally taken in general and their effectiveness is well known. On the other hand, the structure of the fourth variation presents an effective prevention of infiltration against the former route. Specifically, since the device of the fourth variation comprises the interface between the bend surface 7LSE and the mold resin 5, the interface between the side surface 7SS and the mold resin 5, the interface between the side surface 6SS and the mold resin 5, the interface between the bend surface 6USIF and the mold resin 5, the interface between the side surface 8SS and the mold resin 5, the interface between the main surface 8T and the mold resin 5 and the like for the former route, as viewed relatively, the distance for the route of infiltration is set longer. Therefore, the device of the fourth variation makes it hard for the moisture infiltrating into the package 10 from the outside through the detachment portion to reach the power semiconductor chip 2.

Thus, by applying the fourth variation in which the end portion 6P2E of the insulating resin layer 6 and the end portion 7P2E of the metal layer 7 are three-dimensionally folded in the mold resin 5, it is possible to improve the long-term reliability of the present semiconductor device through improvement in withstand voltage characteristics accompanying the improvement in adhesion and eliminate the necessity of unnecessarily increasing the sizes of the insulating resin layer 6 and the metal layer 7.

(Supplementary Note)

While the invention has been shown and described in detail, the foregoing description is in all aspects illustrative and not restrictive. It is therefore understood that numerous modifications and variations can be devised without departing from the scope of the invention.

What is claimed is:

1. A mold resin-sealed power semiconductor device, comprising:

a metal plate comprising a main surface, a bottom surface opposed to said main surface in a direction of its thickness and side surfaces sandwiched between said main surface and said bottom surface, said metal plate serving as a heat sink;

a first lead frame comprising a first inner lead portion which comprises a tip portion directly fixed onto a peripheral portion of said main surface of said metal plate and a first outer lead portion continuously connected to said first inner lead portion;

a second lead frame comprising a second inner lead portion which comprises a tip portion having an electrode and a second outer lead portion continuously connected to said second inner lead portion;

a power semiconductor chip comprising a lower surface having a conductive pattern fixed onto a center portion of said main surface of said metal plate with a conductive layer interposed therebetween, an upper surface opposed to said lower surface in a direction of its thickness, having an electrode pattern electrically connected to said electrode of said second inner lead portion through a metal wire directly connected to said said electrode of said second inner lead portion and side surfaces sandwiched between said upper surface and said lower surface;

an insulating resin layer comprising an upper surface fixed onto said bottom surface of said metal plate, being in contact with said bottom surface, a lower surface opposed to said upper surface in a direction of its thickness and side surfaces sandwiched between said upper surface and said lower surface;

a metal layer comprising an upper surface fixed onto said lower surface of said insulating resin layer, being in contact with said lower surface, a lower surface opposed to said upper surface in a direction of its thickness with at least a portion thereof exposed outside, said portion of said lower surface being positioned immediately below an interface between said insulating resin layer and said metal plate and side surfaces sandwiched between said upper surface and said lower surface; and a mold resin covering at least said first and second inner lead portions, said metal wire, said upper surface and said side surfaces of said power semiconductor chip, said conductive layer, and said main surface and said side surfaces of said metal plate, to form a package, wherein the size of said upper surface of said insulating resin layer is larger than the size of said bottom surface of said metal plate, said upper surface of said insulating resin layer entirely includes said interface between said insulating resin layer and said metal plate, the size of said upper surface of said metal layer is equal to that of said lower surface of said insulating resin layer, said mold resin fully covers at least said first and second innner lead portions, said metal wire, said upper surface and said side surfaces of said power semiconductor chip, said conductive layer, said main surface and said side surfaces of said metal plate, an outer portion in said upper surface of said insulating resin layer which is positioned outside said interface between said insulating resin layer and said metal plate, said side surfaces of said insulating resin layer and said side surfaces of said metal layer, said portion which is exposed in said lower surface of said metal layer is part of a bottom surface of said package, and said insulating resin layer comprises:

a first portion which is positioned under said interface between said insulating resin layer and said metal plate; and a second portion which is positioned under said outer portion in said upper surface of said insulating resin layer said outer portion positioned outside said interface between said insulating resin layer and said metal plate, and said first portion is thinner than said second portion.

2. The mold resin-sealed power semiconductor device according to claim 1, wherein said insulating resin layer comprises thixotropy which is a physical property to present no fluidity under a relatively low pressure and present fluidity under a relatively high pressure.

3. The mold resin-sealed power semiconductor device according to claim 2, wherein said insulating resin layer comprises at least one kind of inorganic filler out of a scale-like inorganic filler, a needle-like inorganic filler and an inorganic filler having hyperfine grains whose outside diameter is 1 μm or less.

4. The mold resin-sealed power semiconductor device according to claim 1, wherein said second portion of said insulating resin layer and a peripheral portion of said metal layer which is fixed to said second portion are bent towards the inside of said mold resin, and only a portion in said lower surface of said metal layer other than a bent lower surface portion included in said peripheral portion is exposed outside.

* * * * *